US012690279B2

(12) United States Patent
Okuda et al.

(10) Patent No.: US 12,690,279 B2
(45) Date of Patent: Jul. 21, 2026

(54) ELECTROMAGNETIC WAVE DETECTOR, ELECTROMAGNETIC WAVE DETECTOR ARRAY, AND MANUFACTURING METHOD OF ELECTROMAGNETIC WAVE DETECTOR

(71) Applicant: Mitsubishi Electric Corporation, Tokyo (JP)

(72) Inventors: Satoshi Okuda, Tokyo (JP); Shimpei Ogawa, Tokyo (JP); Shoichiro Fukushima, Tokyo (JP); Masaaki Shimatani, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 541 days.

(21) Appl. No.: 17/793,655

(22) PCT Filed: Mar. 27, 2020

(86) PCT No.: PCT/JP2020/014284
§ 371 (c)(1),
(2) Date: Jul. 19, 2022

(87) PCT Pub. No.: WO2021/192296
PCT Pub. Date: Sep. 30, 2021

(65) Prior Publication Data
US 2023/0057648 A1    Feb. 23, 2023

(51) Int. Cl.
*H10F 30/227* (2025.01)
*H10F 71/00* (2025.01)

(52) U.S. Cl.
CPC .......... *H10F 30/227* (2025.01); *H10F 71/00* (2025.01)

(58) Field of Classification Search
CPC ............................ H01L 31/108; H01L 31/18; H01L 31/022408
See application file for complete search history.

(56) References Cited

U.S. PATENT DOCUMENTS

2015/0243826 A1    8/2015  An et al.
2017/0078603 A1*   3/2017  Yamasaki ............ H04N 25/767
2017/0256667 A1*   9/2017  Lee ........................ H10F 30/282
2018/0053871 A1*   2/2018  Amirmazlaghani .. H10F 77/206
(Continued)

OTHER PUBLICATIONS

International Search Report and Written Opinion mailed on Jun. 23, 2020, received for PCT Application PCT/JP2020/014284, filed on Mar. 27, 2020, 8 pages including English Translation.

*Primary Examiner* — Eliseo Ramos Feliciano
*Assistant Examiner* — Thaddeus J Kolb
(74) *Attorney, Agent, or Firm* — XSENSUS LLP

(57) ABSTRACT

An electromagnetic wave detector includes a semiconductor substrate, a first insulating film disposed on the semiconductor substrate and formed so as to expose a part of the semiconductor substrate, a first electrode disposed on the first insulating film, a two-dimensional material layer having a joint part forming a Schottky junction with the semiconductor substrate in a part of the semiconductor substrate, the two-dimensional material layer extending from the joint part to the first electrode over the first insulating film, a second electrode in contact with the semiconductor substrate, and a control electrode disposed at least partly around the joint part in plan view to form a Schottky junction with the semiconductor substrate.

16 Claims, 13 Drawing Sheets

(56) References Cited

U.S. PATENT DOCUMENTS

2019/0305157 A1* 10/2019 Kub .......................... H10F 30/21
2022/0278141 A1* 9/2022 Hamasaki ........... H10F 39/8057
2023/0178611 A1* 6/2023 Raring ................. H10D 62/824
438/31

* cited by examiner

| S1 | PREPARING STEP |
| S2 | CONTROL ELECTRODE FORMING STEP |
| S3 | SECOND ELECTRODE FORMING STEP |
| S4 | FIRST INSULATING FILM FORMING STEP |
| S5 | FIRST ELECTRODE FORMING STEP |
| S6 | EXPOSED PART FORMING STEP |
| S7 | TWO-DIMENSIONAL MATERIAL LAYER FORMING STEP |

ELECTROMAGNETIC WAVE DETECTOR, ELECTROMAGNETIC WAVE DETECTOR ARRAY, AND MANUFACTURING METHOD OF ELECTROMAGNETIC WAVE DETECTOR

CROSS-REFERENCE TO RELATED APPLICATIONS

The present application is based on PCT filing PCT/JP2020/014284, filed Mar. 27, 2020, the entire contents of which are incorporated herein by reference.

TECHNICAL FIELD

The present disclosure relates to an electromagnetic wave detector, an electromagnetic wave detector array, and a manufacturing method of an electromagnetic wave detector.

BACKGROUND ART

As a material of an electromagnetic wave detection layer used in a next-generation electromagnetic wave detector, graphene having extremely high mobility, which is an example of a two-dimensional material layer, has been known. Furthermore, as a next-generation electromagnetic wave detector, an electromagnetic wave detector using a graphene field effect transistor obtained by applying monolayer graphene or multilayer graphene to a channel of a field effect transistor has been known.

Since the graphene of the graphene field effect transistor has a zero or minute band gap, there is a problem that a current (dark current) is large in a state where the graphene field effect transistor is not irradiated with electromagnetic waves.

US 2015/0243826 A1 (PTL 1) discloses a structure where, in order to reduce the dark current of the graphene field effect transistor, in an opening formed in an insulating film covering a surface of a silicon substrate, graphene formed to cover the opening is in direct contact with the silicon substrate.

CITATION LIST

Patent Literature

PTL 1: US 2015/0243826 A1

SUMMARY OF INVENTION

Technical Problem

It is, however, difficult for an electromagnetic wave detector having the structure disclosed in PTL 1 to reduce variations in the dark current for each electromagnetic wave detector (pixel).

For example, in a step of manufacturing the electromagnetic wave detector, there is a case where foreign matter such as moisture or resist remains at the junction interface between the silicon substrate and the graphene. In such an electromagnetic wave detector, the occurrence of a leakage current prevents the dark current from being sufficiently reduced. It is therefore difficult for the electromagnetic wave detector to sufficiently reduce variations in the dark current for each electromagnetic wave detector.

It is therefore a main object of the present disclosure to provide an electromagnetic wave detector in which variations in dark current for each electromagnetic wave detector are reduced, an electromagnetic wave detector array, and a manufacturing method of an electromagnetic wave detector.

Solution to Problem

An electromagnetic wave detector according to the present disclosure includes a semiconductor substrate, a first insulating film disposed on the semiconductor substrate and formed so as to expose a part of the semiconductor substrate, a first electrode disposed on the first insulating film, a two-dimensional material layer having a joint part forming a Schottky junction with the semiconductor substrate in a part of the semiconductor substrate, the two-dimensional material layer extending from the joint part to the first electrode over the first insulating film, a second electrode in contact with the semiconductor substrate, and a control electrode disposed at least partly around the joint part in plan view to form a Schottky junction with the semiconductor substrate.

Advantageous Effects of Invention

According to the present disclosure, it is possible to provide the electromagnetic wave detector in which variations in dark current for each electromagnetic wave detector are reduced, an electromagnetic wave detector array, and a manufacturing method of an electromagnetic wave detector.

DESCRIPTION OF EMBODIMENTS

Figure 1:
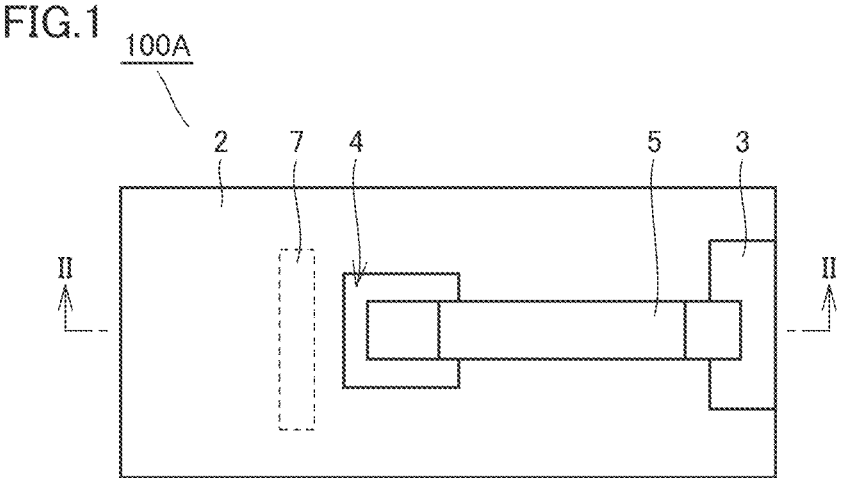
FIG. 1 is a schematic plan view of an electromagnetic wave detector according to a first embodiment.

With reference to the drawings, embodiments according to the present invention will be described below. Note that, in the following drawings, the same or corresponding parts are denoted by the same reference numerals to avoid the description from being redundant.

For the embodiments described below, the drawings are schematic representations and are given for conceptually describing functions or structures. Further, the present invention is not limited by the embodiments described below. Unless otherwise specified, the basic configuration of the electromagnetic wave detector is common to all the embodiments. Further, components denoted by the same reference numerals are identical or equivalent to each other as described above. This applies to the entire specification.

The following embodiments will be described using a configuration where the electromagnetic wave detector detects visible light or infrared light, but the present invention is not limited to such a configuration. The embodiments described below are also effective as a detector that detects a radio wave such as an X-ray, ultraviolet light, near-infrared light, a terahertz (THz) wave, or a microwave, in addition to visible light or infrared light. Note that, in the embodiments according to the present invention, such light and radio wave are collectively referred to as an electromagnetic wave.

Further, in the embodiments according to the present invention, the term p-type graphene or n-type graphene may be used as graphene. In the following embodiments, graphene larger in the number of holes than intrinsic graphene is referred to as p-type graphene, and graphene larger in the number of electrons is referred to as n-type graphene.

Further, in the embodiments according to the present invention, the term n-type or p-type may be used for a material of a member in contact with graphene, which is an example of the two-dimensional material layer. Here, for example, an n-type material indicates a material having electron-donating tendencies, and a p-type material indicates a material having electron-withdrawing tendencies. Further, with uneven distribution of charges in molecules observed, a material having a larger electron concentration is referred to as an n-type, and a material having a larger hole concentration is referred to as an p-type. As such materials, either an organic substance and an inorganic substance or a mixture of the organic substance and the inorganic substance may be used.

Further, the following embodiments will be described using graphene as an example of the material of the two-dimensional material layer, but the material of the two-dimensional material layer is not limited to graphene. For example, as a material of the two-dimensional material layer, a material such as transition metal dichalcogenide (TMD), black phosphorus, silicene (two-dimensional honeycomb structure of silicon atoms), or germanene (two-dimensional honeycomb structure of germanium atoms) may be used. Examples of the transition metal dichalcogenide include transition metal dichalcogenides such as molybdenum sulfide ($MoS_2$), tungsten sulfide ($WS_2$), and tungsten selenide ($WSe_2$). Such materials are similar in structure to graphene and are capable of arranging atoms in a monolayer in a two-dimensional plane. Therefore, even when the materials are applied to the two-dimensional material layer, it is possible to obtain the same actions and effects as when graphene is applied to the two-dimensional material layer.

First Embodiment

Figure 2:
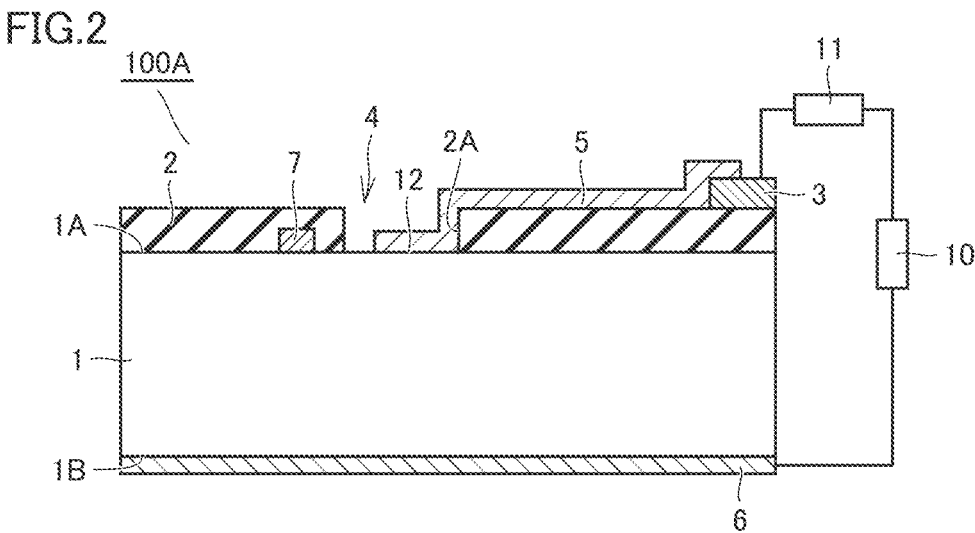
FIG. 2 is a schematic cross-sectional view taken along a line 11-11 in FIG. 1.

As illustrated in FIGS. 1 and 2, an electromagnetic wave detector 100A according to a first embodiment mainly includes a semiconductor substrate 1, a first insulating film 2, a first electrode 3, a two-dimensional material layer 5, a second electrode 6, and a control electrode 7.

Semiconductor substrate 1 has a first surface 1A and a second surface 1B. Second surface 1B is located on a side opposite from first surface 1A. First surface 1A and second surface 1B are, for example, flat surfaces.

Semiconductor substrate 1 has sensitivity to an electromagnetic wave of a detection wavelength predetermined from among the electromagnetic waves described above. Semiconductor substrate 1 has n-type or p-type conductivity, and is provided to generate photocarriers when the electromagnetic wave of the predetermined detection wavelength impinges on semiconductor substrate 1. A semiconductor material of semiconductor substrate 1 may be selected as desired in accordance with the detection wavelength to which sensitivity is required.

The semiconductor material of semiconductor substrate 1 includes at least one selected from the group consisting of a compound semiconductor such as silicon (Si), germanium (Ge), a III-V semiconductor or a II-V semiconductor, HgCdTe, InSb, lead selenide (PbSe), lead sulfide (PbS), cadmium sulfide (CdS), gallium nitride (GaN), silicon carbide (SiC), gallium phosphide (GaP), indium gallium arsenide (InGaAs), and indium arsenide (InAs). Semiconductor substrate 1 may be, for example, a substrate containing quantum wells or quantum dots made of two or more semiconductor materials selected from the above-described group, a substrate including a Type-II superlattice, or a substrate that is a combination of the above.

First insulating film 2 is disposed on first surface 1A of semiconductor substrate 1. First electrode 3 is disposed on first insulating film 2. First insulating film 2 is formed so as to expose a part of first surface 1A of semiconductor substrate 1. In other words, the part of first surface 1A of semiconductor substrate 1 serves as an exposed part 4 exposed from first insulating film 2. First insulating film 2 is formed such that a partial region of first insulating film 2 that overlaps first electrode 3 in plan view is spaced apart from the other partial region of first insulating film 2, and has an end surface 2A extending in a direction intersecting first surface 1A. A material of first insulating film 2 and a thickness of first insulating film 2 are selected so as to prevent tunnel current from being generated between semiconductor substrate 1 and first electrode 3.

The material of first insulating film 2 includes, for example, at least one selected from the group consisting of silicon oxide ($SiO_2$), silicon nitride ($Si_3N_4$), hafnium oxide ($HfO_2$), aluminum oxide ($Al_2O_3$), nickel oxide (NiO), and boron nitride (BN).

First electrode 3 is disposed on first insulating film 2 at a distance from end surface 2A. First electrode 3 is electrically connected to two-dimensional material layer 5. Second electrode 6 is in contact with semiconductor substrate 1. Second electrode 6 is in contact with second surface 1B of semiconductor substrate 1, for example. Preferably, second electrode 6 is in ohmic contact with semiconductor substrate 1. As illustrated in FIG. 2, first electrode 3 and second electrode 6 are electrically connected to a power supply circuit. The power supply circuit includes a power supply 11 that applies a voltage between first electrode 3 and second electrode 6, and an ammeter 10 that measures the current flowing between first electrode 3 and second electrode 6.

A material of first electrode 3 and second electrode 6 may be any electric conductor, but is preferably a material that makes ohmic contact with semiconductor substrate 1, and the material includes, for example, at least one selected from the group consisting of gold (Au), silver (Ag), copper (Cu), aluminum (Al), nickel (Ni), chromium (Cr), and palladium (Pd). An adhesion layer (not illustrated) that increases adhesion between first electrode 3 and first insulating film 2 may be formed between first electrode 3 and first insulating film 2. An adhesion layer (not illustrated) that increases adhesion between second electrode 6 and semiconductor substrate 1 may be formed between second electrode 6 and semiconductor substrate 1. A material of the adhesion layer includes, for example, a metal material such as chromium (Cr) or titanium (Ti).

Two-dimensional material layer 5 has a joint part 12 that forms a Schottky junction with at least apart of exposed part 4. Hereinafter, the Schottky junction between two-dimensional material layer 5 and semiconductor substrate 1 is referred to as a first Schottky junction. Two-dimensional material layer 5 is in contact with a part of exposed part 4, for example. Two-dimensional material layer 5 extends from joint part 12 to first electrode 3 over first insulating film 2.

Two-dimensional material layer 5 has, for example, a longitudinal direction and a lateral direction intersecting the longitudinal direction. One end of two-dimensional material layer 5 in the longitudinal direction serves as joint part 12. The one end of two-dimensional material layer 5 in the longitudinal direction serves as joint part 12 over the lateral direction. The other end of two-dimensional material layer 5 in the longitudinal direction is electrically connected to first electrode 3.

Two-dimensional material layer 5 is, for example, monolayer graphene or multilayer graphene. Two-dimensional material layer 5 may include, for example, graphene nanoribbons. Two-dimensional material layer 5 may include turbostratic multilayer graphene composed of a plurality of pieces of monolayer graphene. As described above, a material of two-dimensional material layer 5 may include at least one selected from the group consisting of graphene, transition metal dichalcogenide, black phosphorus, silicene, and germanene. Further, two-dimensional material layer 5 may have a hetero-multilayer structure in which two or more materials selected from the above-described group are combined.

A protective film (not illustrated) may be formed on two-dimensional material layer 5. A material of such a protective film includes, for example, at least one selected from the group consisting of $SiO_2$, $Si_3N_4$, $HfO_2$, $Al_2O_3$, NiO, and BN.

Control electrode 7 is disposed partly around joint part 12 in plan view, and forms a Schottky junction with semiconductor substrate 1. Hereinafter, the Schottky junction between control electrode 7 and semiconductor substrate 1 is referred to as a second Schottky junction. Control electrode 7 is in contact with first surface 1A of semiconductor substrate 1. Control electrode 7 is disposed at a distance from joint part 12, for example. Control electrode 7 is covered with first insulating film 2, for example. Control electrode 7 is not in direct contact with two-dimensional material layer 5. Control electrode 7 is not connected to a power supply.

Two-dimensional material layer 5 and control electrode 7 are disposed such that a depletion layer of the second Schottky junction is connected to a depletion layer formed in the first Schottky junction when the first Schottky junction is reverse-biased. Two-dimensional material layer 5 and control electrode 7 are disposed such that the depletion layer formed as a result of the connection of the depletion layer of the second Schottky junction to the depletion layer formed in the first Schottky junction when the first Schottky junction is reverse-biased covers the entire interface of the first Schottky junction.

Control electrode 7 is disposed adjacent to a side of joint part 12 remote from first electrode 3 in the longitudinal direction of two-dimensional material layer 5, for example. Control electrode 7 has, for example, a longitudinal direction and a lateral direction intersecting the longitudinal direction. The longitudinal direction of control electrode 7 coincides with the lateral direction of two-dimensional material layer 5, for example. The lateral direction of the control electrode 7 coincides with the longitudinal direction of two-dimensional material layer 5, for example. A width of control electrode 7 in the longitudinal direction is greater than or equal to a width of two-dimensional material layer 5 in the lateral direction. The width of control electrode 7 in the longitudinal direction is greater than the width of two-dimensional material layer 5 in the lateral direction, for example. A width of joint part 12 in the longitudinal direction of two-dimensional material layer 5 is greater than a width of control electrode 7 in the lateral direction, for example.

A material of control electrode 7 includes a metal material that forms a Schottky junction with semiconductor substrate 1. When semiconductor substrate 1 has n-type conductivity, the material of control electrode 7 is metal that is larger in work function than the semiconductor material of semiconductor substrate 1.

Preferably, the material of control electrode 7 is metal selected such that a barrier height of the second Schottky junction (a difference between the work function of the material of control electrode 7 and the electron affinity of the material of semiconductor substrate 1) is higher than a barrier height of the first Schottky junction (a difference between the work function of the material of two-dimensional material layer 5 and the electron affinity of the material of semiconductor substrate 1). When semiconductor substrate 1 is an n-type Si substrate, the material of control electrode 7 includes, for example, at least either Au or Ni. When semiconductor substrate 1 has p-type conductivity, the material of control electrode 7 is metal that is smaller in work function than the semiconductor material of semiconductor substrate 1. When semiconductor substrate 1 is a p-type Si substrate, the material of control electrode 7 includes, for example, at least either indium (In) or tin (Sn).

<Manufacturing Method of Electromagnetic Wave Detector>

Figure 3:
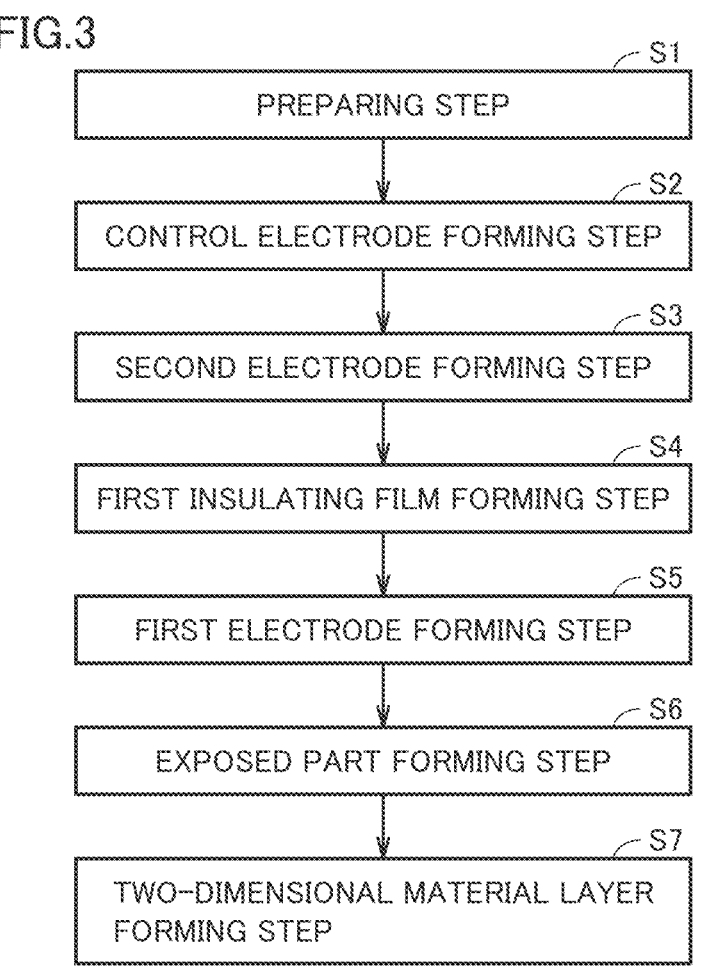
FIG. 3 is a flowchart for describing a manufacturing method of the electromagnetic wave detector according to the first embodiment.

FIG. 3 is a flowchart for describing a manufacturing method of the electromagnetic wave detector according to the first embodiment. With reference to FIG. 3, the manufacturing method of the electromagnetic wave detector illustrated in FIGS. 1 and 2 will be described.

First, a preparing step (S1) shown in FIG. 3 is performed. In this step (S1), flat semiconductor substrate 1 is prepared. Semiconductor substrate 1 has first surface 1A and second surface 1B. A semiconductor material of semiconductor substrate 1 is a semiconductor material having sensitivity to a predetermined detection wavelength.

Next, a control electrode forming step (S2) is performed. In this step (S2), control electrode 7 is formed on first surface 1A of semiconductor substrate 1. The method for forming control electrode 7 is not limited to any specific method, and examples of the method include a film forming process by vapor deposition or sputtering, a photolithography process, and an etching process.

Next, a second electrode forming step (S3) is performed. In this step (S3), second electrode 6 is formed on second surface 1B of semiconductor substrate 1. The method for forming second electrode 6 is not limited to any specific method, and examples of the method include a film forming process by vapor deposition or sputtering, a photolithography process, and an etching process. Before second electrode 6 is formed, the above-described adhesion layer may be formed in advance in a region of semiconductor substrate 1 to which second electrode 6 is connected in order to increase adhesion between semiconductor substrate 1 and second electrode 6.

Next, an insulating film forming step (S4) is performed. In this step (S4), first insulating film 2 is formed on first surface 1A of semiconductor substrate 1. The method for forming first insulating film 2 is not limited to any specific method, and is, for example, plasma chemical vapor deposition (CVD) or atomic layer deposition (ALD).

Note that, in order to prevent semiconductor substrate 1 from being damaged or contaminated due to etching in an exposed part forming step (S6) (to be described later), a barrier film may be formed between semiconductor substrate 1 and first insulating film 2 immediately before the insulating film forming step (S4). A material of the barrier film may be a material that is higher in resistance to etchant used in the exposed part forming step (S6)(a material lower in etching rate) than the material of first insulating film 2, and is, for example, silicon nitride (SiN), aluminum oxide ($Al_2O_3$), or graphene.

Next, a first electrode forming step (S5) is performed. In this step (S5), first electrode 3 is formed on first insulating film 2. The method for forming first electrode 3 is not limited to any specific method, and examples of the method include a film forming process by vapor deposition or sputtering, a photolithography process, and an etching process. Before first electrode 3 is formed, the above-described adhesion layer may be formed in advance in a region of first insulating film 2 to which first electrode 3 is connected in order to increase adhesion between first insulating film 2 and first electrode 3.

Next, the exposed part forming step (S6) is performed. In this step (S6), exposed part 4 exposed from first insulating film 2 is formed on semiconductor substrate 1 by removing a part of first insulating film 2. Specifically, a resist mask is formed on first insulating film 2 by photolithography or EB lithography. The resist mask is formed so as to cover a region where first insulating film 2 is to be formed and to expose a region where exposed part 4 is to be formed. Subsequently, first insulating film 2 is etched using the resist mask as an etching mask. The etching method may be selected as desired from among wet etching using hydrofluoric acid or the like and dry etching using reactive ion etching or the like. After the etching, the resist mask is removed. As a result, exposed part 4 is formed. The step (S6) may be performed before the step (S5).

Next, a two-dimensional material layer forming step (S7) is performed. In this step (S7), two-dimensional material layer 5 is formed on at least a part of each of first insulating film 2 and exposed part 4. The method for forming two-dimensional material layer 5 is not limited to any specific method, and examples of the method include a film forming process by epitaxial growth, a photolithography process, and an etching process.

Through the above-described steps (S1 to S7), electromagnetic wave detector 100A illustrated in FIGS. 1 and 2 is manufactured.

Note that the exposed part forming step (S6) may be performed before the first electrode forming step (S5). That is, under the manufacturing method of electromagnetic wave detector 100A, the step (S1), the step (S2), the step (S3), the step (S4), the step (S6), the step (S5), and the step (S7) may be performed in this order.

<Operation>

Next, a description will be given of how the electromagnetic wave detector according to the present embodiment operates.

Figure 4:
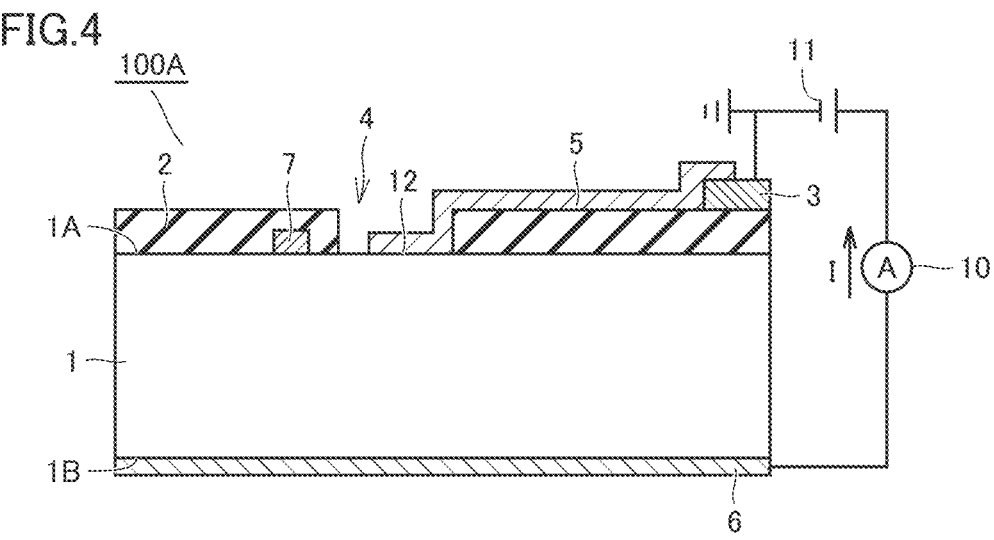
FIG. 4 is a schematic cross-sectional view of the electromagnetic wave detector according to the first embodiment, illustrating an example of how the electromagnetic wave detector operates.

FIG. 4 is a schematic cross-sectional view of electromagnetic wave detector 100A, illustrating an example of how electromagnetic wave detector 100A operates. As illustrated in FIG. 4, the power supply circuit (not illustrated) is electrically connected between first electrode 3 and second electrode 6. The power supply circuit includes power supply 11 that applies a voltage V between first electrode 3 and second electrode 6, and ammeter 10 that measures a current I flowing through the power supply circuit. A positive voltage or a negative voltage is selected in accordance with the conductivity type (doping type) of semiconductor substrate 1 so as to cause the first Schottky junction to be reverse-biased. A positive voltage is applied to both first electrode 3 and second electrode 6 by power supply 11 so as to make first electrode 3 higher in potential than second electrode 6. When the conductivity type is p-type, a positive voltage is applied between first electrode 3 and second electrode 6 as illustrated in FIG. 4. When the conductivity type is n-type, a negative voltage is applied between first electrode 3 and second electrode 6. Accordingly, electromagnetic wave detector 100A is brought into a state where electromagnetic wave detector 100A is enabled to an electromagnetic wave of a wavelength to which semiconductor substrate 1 has sensitivity.

In the state where electromagnetic wave detector 100A is enabled to detect the electromagnetic wave, the first Schottky junction is reverse-biased. Therefore, the depletion layer at the interface of the first Schottky junction extends to its surroundings to connect to the depletion layer of the second Schottky junction. As a result, in electromagnetic wave detector 100A in which the first Schottky junction and the second Schottky junction are formed, dark current is reduced as compared with an electromagnetic wave detector in which only the first Schottky junction is formed.

Figure 5:
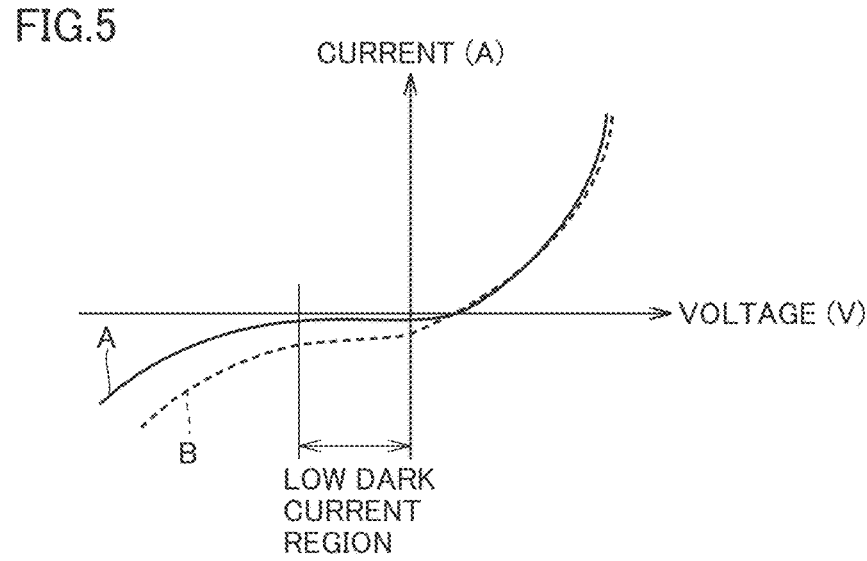
FIG. 5 is a graph illustrating an example of how the electromagnetic wave detector according to the first embodiment operates.

FIG. 5 is a graph illustrating an example of how electromagnetic wave detector 100A operates. The horizontal axis of FIG. 5 indicates the voltage (unit: V) applied to the first Schottky junction by power supply 11, and the vertical axis of FIG. 5 indicates the current value (unit: A) measured by ammeter 10. A solid line in FIG. 5 indicates a state where electromagnetic wave detector 100A enabled to detect the electromagnetic wave is not irradiated with the electromagnetic wave, and a dotted line in FIG. 5 indicates a state where electromagnetic wave detector 100A enabled to detect the electromagnetic wave is irradiated with the electromagnetic wave.

As indicated by the solid line in FIG. 5, in the state where electromagnetic wave detector 100A is not irradiated with the electromagnetic wave, the dark current is kept low. On the other hand, as indicated by the dotted line in FIG. 5, in the state where electromagnetic wave detector 100A is irradiated with the electromagnetic wave, photocarriers are generated in the depletion layer of semiconductor substrate 1. When photocarriers generated in semiconductor substrate 1 in the vicinity of joint part 12 flow into two-dimensional material layer 5, reverse current increases, and current I changes accordingly. As described above, a current component that causes a change in current I due to electromagnetic wave irradiation is referred to as photocurrent. Note that when the conductivity type of semiconductor substrate 1 is n-type, holes flow into two-dimensional material layer 5, so that reverse current increases, and current I changes accordingly.

Furthermore, in the state where the first Schottky junction is reverse-biased, a depletion layer is also formed at the interface between semiconductor substrate 1 and first insulating film 2. When the electromagnetic wave impinges on semiconductor substrate 1, photocarriers (for example, holes when the conductivity type of semiconductor substrate 1 is n-type) are also generated in the depletion layer and accumulated at the interface between semiconductor substrate 1 and first insulating film 2. The photocarriers accumulated at the interface modulate carrier density of two-dimensional material layer 5 serving as a channel through first insulating film 2, like a gate voltage applied to a transistor. This causes a change in conductivity of two-dimensional material layer 5 and causes a change in current I flowing through two-dimensional material layer 5. This effect is referred to as photogating effect. Since the current due to the photocarriers generated by the photoelectric conversion of semiconductor substrate 1 is amplified by the photogating effect, the quantum efficiency calculated from the photocurrent becomes an extremely large value. This makes electromagnetic wave detector 100A high in detection sensitivity.

<Actions and Effects>

As described above, in the electromagnetic wave detector disclosed in PTL 1 in which the second Schottky junction is not formed, and only the Schottky junction between the graphene and the silicon substrate is formed, there is a case where the dark current is not sufficiently reduced due to residual foreign matter such as moisture and photoresist at the junction interface between the graphene and the silicon substrate. Further, there is a case where the Fermi level of the graphene is modulated by the foreign matter, and the height of the Schottky barrier is lowered. For this reason, in the electromagnetic wave detector disclosed in PTL 1, it is difficult to sufficiently reduce variations in the dark current for each electromagnetic wave detector (pixel). The variations in the dark current for each electromagnetic wave detector (pixel) become a problem because the manufacturing yield of an electromagnetic wave detector array is lowered particularly when a plurality of electromagnetic wave detectors are connected to form the electromagnetic wave detector array.

In electromagnetic wave detector 100A, the second Schottky junction between control electrode 7 and semiconductor substrate 1 is formed around the first Schottky junction between two-dimensional material layer 5 and semiconductor substrate 1. Therefore, in electromagnetic wave detector 100A, applying a predetermined reverse-bias voltage to the first Schottky junction allows the depletion layer at the interface of the first Schottky junction to connect to the depletion layer of the second Schottky junction. In electromagnetic wave detector 100A in which the first Schottky junction and the second Schottky junction are formed, the dark current at the first Schottky junction is reduced as compared with the electromagnetic wave detector in which only the first Schottky junction is formed.

Furthermore, under the manufacturing method of electromagnetic wave detector 100A, the two-dimensional material layer forming step (S7) is performed after the insulating film forming step (S4) and the exposed part forming step (S6), whereas the control electrode forming step (S2) is performed before the insulating film forming step (S4) and the exposed part forming step (S6). This makes the foreign matter less likely to remain in the region on first surface 1A where control electrode 7 is to be formed in the control electrode forming step (S2) than in the region on first surface 1A where two-dimensional material layer 5 is to be formed in the two-dimensional material layer forming step (S7). Therefore, in electromagnetic wave detector 100A, variations in the barrier height of the second Schottky junction (the difference between the work function of the material of control electrode 7 and the electron affinity of the material of semiconductor substrate 1) for each electromagnetic wave detector 100A are smaller than variations in the barrier height of the first Schottky junction (the difference between the work function of the material of two-dimensional material layer 5 and the electron affinity of the material of semiconductor substrate 1) for each electromagnetic wave detector 100A. As a result, in electromagnetic wave detector 100A, variations in the dark current for each electromagnetic wave detector 100A are reduced as compared with the electromagnetic wave detector in which only the first Schottky junction is formed.

Furthermore, since the material of control electrode 7 is a metal material, it is possible for the junction interface of the second Schottky junction between control electrode 7 and semiconductor substrate 1 to prevent the foreign matter from remaining more easily than the junction interface of the first Schottky junction between two-dimensional material layer 5 and semiconductor substrate 1. Furthermore, the Fermi level of the metal material of control electrode 7 is less likely to be modulated than the Fermi level of the material of two-dimensional material layer 5. Therefore, in electromagnetic wave detector 100A, variations in the barrier height of the second Schottky junction for each electromagnetic wave detector 100A are smaller than variations in the barrier height of the first Schottky junction for each electromagnetic wave detector 100A. As a result, in electromagnetic wave detector 100A, variations in the dark current for each electromagnetic wave detector 100A are reduced as compared with the electromagnetic wave detector in which only the first Schottky junction is formed.

Further, in electromagnetic wave detector 100A, the barrier height of the second Schottky junction can be made higher than the barrier height of the first Schottky junction. In such an electromagnetic wave detector 100A, a voltage range (low dark current region in FIG. 4) in which the dark current is reduced becomes wide as compared with the electromagnetic wave detector in which only the first Schottky junction is formed. That is, in electromagnetic wave detector 100A, a large negative voltage can be applied between first electrode 3 and second electrode 6 as compared with the electromagnetic wave detector in which only the first Schottky junction is formed. Therefore, in electromagnetic wave detector 100A, since the depletion layer extends from first surface 1A to a deep region as compared with the electromagnetic wave detector in which only the first Schottky junction is formed, it is possible to take out more photocarriers generated by irradiation with the electromagnetic wave.

For example, when semiconductor substrate 1 is an n-type Si substrate, two-dimensional material layer 5 is monolayer graphene, and the material of control electrode 7 is Ni, the difference between the work function of the material of two-dimensional material layer 5 and the electron affinity of the material of semiconductor substrate 1 is 0.95 eV, and the difference between the work function of the material of control electrode 7 and the electron affinity of the material of semiconductor substrate 1 is 1.17 eV. The number of electrons IMS directed from the metal to the semiconductor in the Schottky junction is expressed as follows using a proportionality constant K, a Boltzmann constant k, a temperature T, and a barrier height φB.

$$\text{IMS} = K \times e^{-\varphi B / kT} \qquad \text{[Math. 1]}$$

Therefore, when the barrier height of the second Schottky junction is 0.22 eV higher than the barrier height of the first Schottky junction, the number of electrons IMS estimated from the former barrier height is smaller by about four orders of magnitude than the number of electrons IMS estimated from the latter barrier height. This allows electromagnetic wave detector 100A in which the barrier height of the second Schottky junction is higher than the barrier height of the first Schottky junction to reduce the dark current as compared with the electromagnetic wave detector in which only the first Schottky junction is formed and electromagnetic wave detector 100A in which the barrier height of the second Schottky junction is about the same as the barrier height of the first Schottky junction.

Furthermore, in electromagnetic wave detector 100A, the amount of photocarriers accumulated at the interface between semiconductor substrate 1 and first insulating film 2 in the region that overlaps two-dimensional material layer 5 in plan view, that is, the region immediately below two-dimensional material layer 5, is large as compared with the electromagnetic wave detector in which only the first Schottky junction is formed. Therefore, in electromagnetic wave detector 100A, the photogating effect is amplified, and the photocurrent increases as compared with the electromagnetic wave detector in which only the first Schottky junction is formed.

As described above, in electromagnetic wave detector 100A, as compared with the electromagnetic wave detector in which only the first Schottky junction is formed, the amount of photocurrent increases while variations in the dark current are reduced, so that the amount of photocurrent largely changes, and the detection sensitivity becomes high accordingly.

(Modification)

Figure 6:
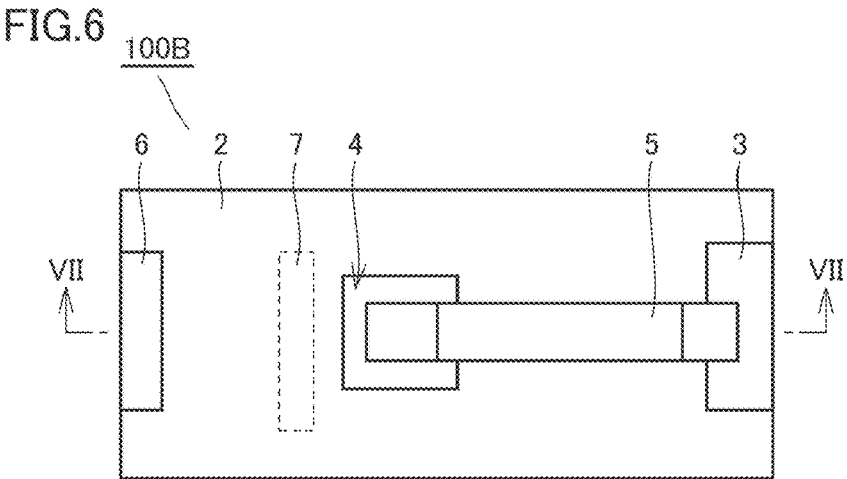
FIG. 6 is a schematic cross-sectional view of a first modification of the electromagnetic wave detector according to the first embodiment.
Figure 7:
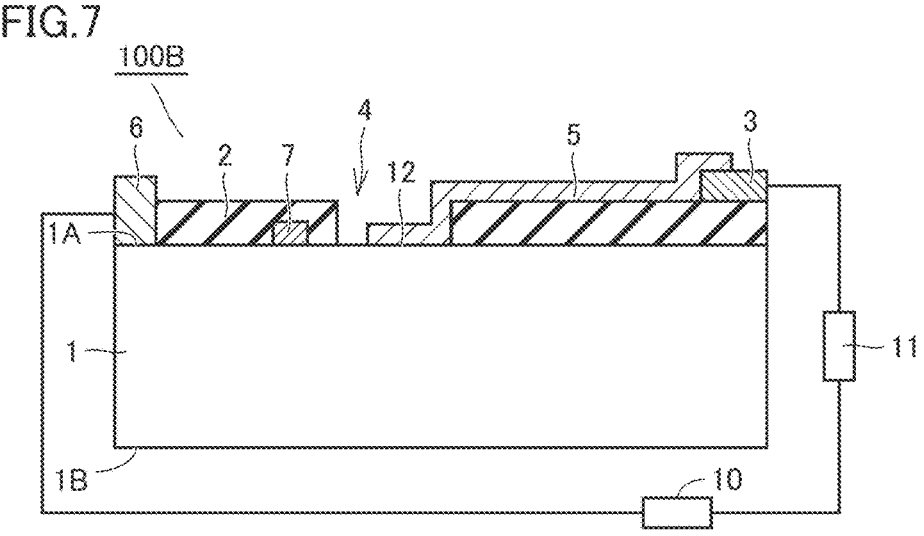
FIG. 7 is a schematic cross-sectional view taken along a line VI-VII in FIG. 6.

FIGS. 6 and 7 are diagrams illustrating an electromagnetic wave detector 100B that is a modification of electromagnetic wave detector 100A. As illustrated in FIGS. 6 and 7, in electromagnetic wave detector 100B, second electrode 6 is in contact with first surface 1A. Second electrode 6 is disposed adjacent to aside of control electrode 7 remote from two-dimensional material layer 5 and first electrode 3, for example. In other words, control electrode 7 is disposed between joint part 12 of two-dimensional material layer 5 and second electrode 6. The width of control electrode 7 in the longitudinal direction is greater than the width of second electrode 6 in the longitudinal direction, for example. As described above, how second electrode 6 is disposed is not particularly limited as long as second electrode 6 is in contact with semiconductor substrate 1.

Figure 8:
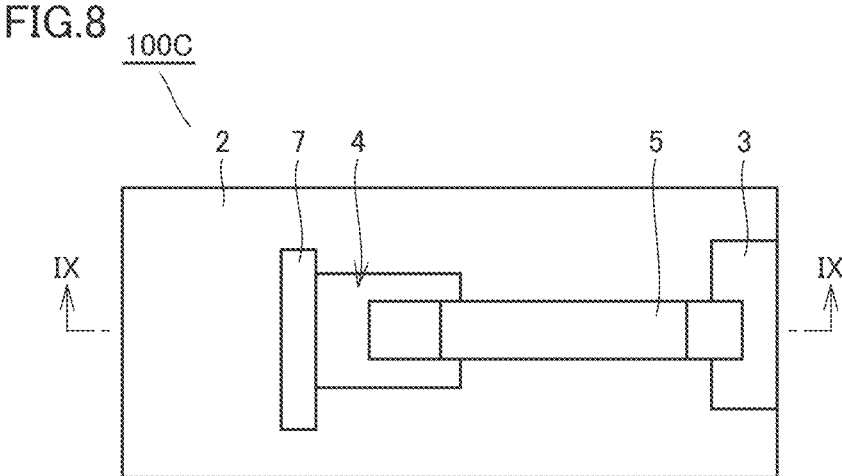
FIG. 8 is a schematic cross-sectional view of a second modification of the electromagnetic wave detector according to the first embodiment.
Figure 9:
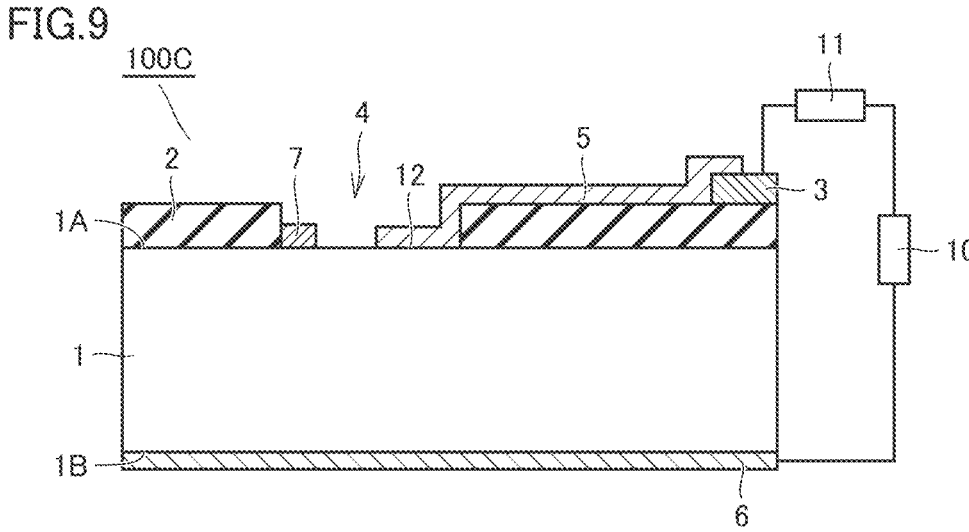
FIG. 9 is a schematic cross-sectional view taken along a line IX-IX in FIG. 8.

FIGS. 8 and 9 are diagrams illustrating an electromagnetic wave detector 100C that is a modification of electromagnetic wave detector 100A. As illustrated in FIGS. 8 and 9, in electromagnetic wave detector 100C, control electrode 7 is disposed on exposed part 4 of semiconductor substrate 1. Control electrode 7 is exposed from first insulating film 2. Control electrode 7 may be partially covered with first insulating film 2 and partially exposed from first insulating film 2. First insulating film 2 needs to be formed at least between first electrode 3 and semiconductor substrate 1 and between a portion of two-dimensional material layer 5 located between joint part 12 and first electrode 3 and semiconductor substrate 1 so as not to generate the tunnel current. That is, in electromagnetic wave detectors 100A, 100B, 100C, most of first surface 1A of semiconductor substrate 1 may serve as exposed part 4.

Second Embodiment

Figure 10:
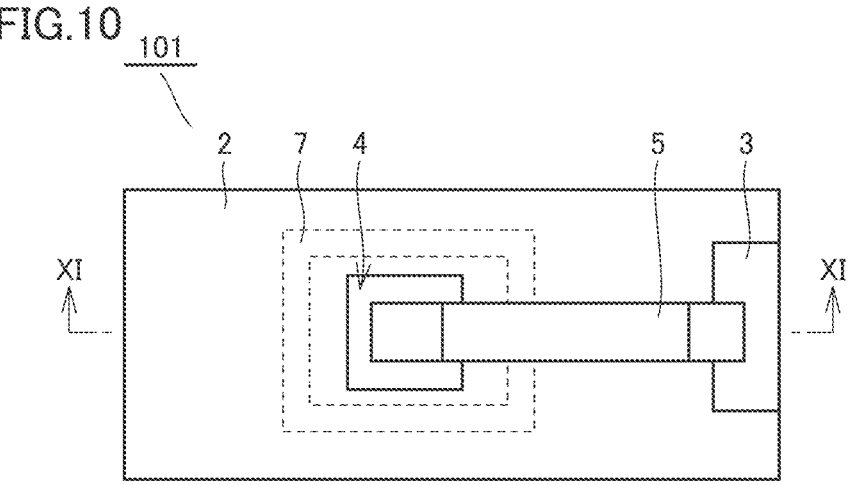
FIG. 10 is a schematic plan view of an electromagnetic wave detector according to a second embodiment.
Figure 11:
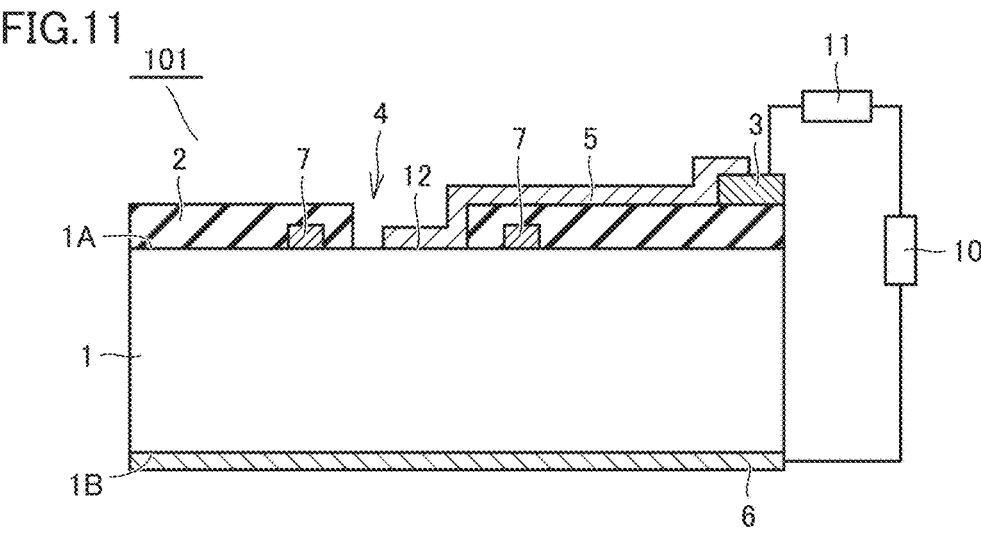
FIG. 11 is a schematic cross-sectional view taken along a line XI-XI in FIG. 10.

FIGS. 10 and 11 are diagrams illustrating an electromagnetic wave detector 101 according to a second embodiment. As illustrated in FIGS. 10 and 11, electromagnetic wave detector 101 has a configuration basically the same as the configuration of electromagnetic wave detector 100A, but is different from electromagnetic wave detector 100A in that control electrode 7 is disposed around joint part 12 so as to place joint part 12 in control electrode 7 in plan view.

An electromagnetic wave detector 101B includes one control electrode 7 formed in an annular shape in plan view.

In plan view, control electrode 7 is disposed around joint part 12 so as to completely surround joint part 12. In plan view, control electrode 7 is disposed around joint part 12 so as to place joint part 12 in control electrode 7 in both the longitudinal direction and the lateral direction of two-dimensional material layer 5.

Of control electrode 7, a pair of portions disposed so as to place joint part 12 between the portions in the longitudinal direction of two-dimensional material layer 5 is, for example, in line symmetry with respect to joint part 12. Of control electrode 7, a pair of portions disposed so as to place joint part 12 between the portions in the lateral direction of the two-dimensional material layer 5 is line-symmetric with respect to joint part 12, for example.

Control electrode 7 is covered with first insulating film 2, for example. In plan view, control electrode 7 is disposed around joint part 12 so as to completely surround exposed part 4, for example.

In plan view, a part of control electrode 7 is disposed so as to overlap a portion of two-dimensional material layer 5 located between joint part 12 and first electrode 3. In other words, a part of control electrode 7 is disposed immediately below the portion of two-dimensional material layer 5 located between joint part 12 and first electrode 3.

Since electromagnetic wave detector 101 has a configuration basically the same as the configuration of electromagnetic wave detector 100A, electromagnetic wave detector 101 can produce the same effects as the effects of electromagnetic wave detector 100A.

Furthermore, in electromagnetic wave detector 101, the depletion layer of the second Schottky junction between control electrode 7 and semiconductor substrate 1 is disposed so as to place the depletion layer of the first Schottky junction between semiconductor substrate 1 and two-dimensional material layer 5 in the depletion layer of the second Schottky junction, so that the depletion layer formed when the first Schottky junction is reverse-biased can more reliably cover the entire interface of the first Schottky junction. Therefore, in electromagnetic wave detector 101, variations in the dark current for each electromagnetic wave detector 100A are stably reduced as compared with electromagnetic wave detector 100A.

(Modification)

Electromagnetic wave detector 101 may include a plurality of control electrodes 7 arranged at intervals in a circumferential direction of joint part 12. In plan view, the plurality of control electrodes 7 include, for example, a pair of control electrodes 7 arranged so as to place joint part 12 between control electrodes 7 in the longitudinal direction of two-dimensional material layer 5, and a pair of control electrodes 7 arranged so as to place joint part 12 between control electrodes 7 in the lateral direction of two-dimensional material layer 5.

Alternatively, electromagnetic wave detector 101 may include a plurality of control electrodes 7 formed in an annular shape in plan view. For example, in plan view, the plurality of control electrodes 7 include a first control electrode disposed on the innermost side and a second control electrode disposed so as to surround joint part 12 and the first control electrode.

Electromagnetic wave detector 101 may the same in configuration as electromagnetic wave detectors 100B, 100C except that control electrode 7 is disposed around joint part 12 so as to place joint part 12 in control electrode 7 in plan view.

Third Embodiment

Figure 12:
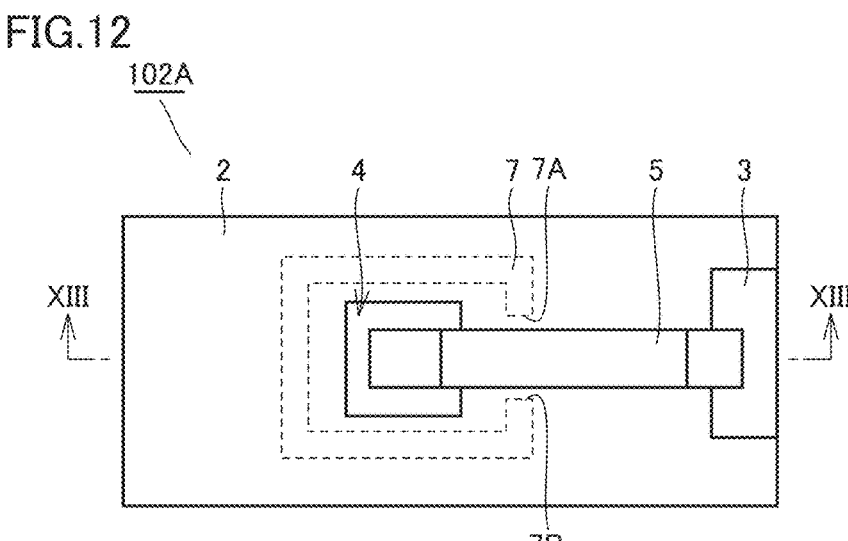
FIG. 12 is a schematic plan view of an electromagnetic wave detector according to a third embodiment.
Figure 13:
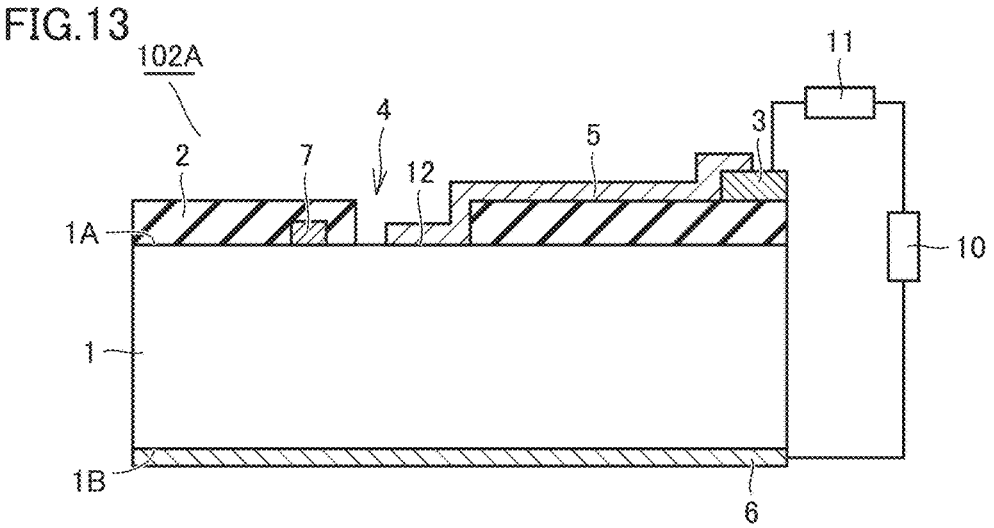
FIG. 13 is a schematic cross-sectional view taken along a line XIII-XIII in FIG. 12.

FIGS. 12 and 13 are diagrams illustrating an electromagnetic wave detector 102A according to a third embodiment.

As illustrated in FIGS. 12 and 13, electromagnetic wave detector 102A has a configuration basically the same as the configuration of electromagnetic wave detector 101 according to the second embodiment, but is different from electromagnetic wave detector 101 in that control electrode 7 is disposed in a region where control electrode 7 does not overlap two-dimensional material layer 5 in plan view. In other words, control electrode 7 is not disposed immediately below two-dimensional material layer 5.

As illustrated in FIG. 12, in plan view, control electrode 7 has, for example, a C shape so as to surround partly around joint part 12. In plan view, control electrode 7 has, for example, an end 7A and an end 7B disposed so as to place two-dimensional material layer 5 between ends 7A, 7B in the lateral direction of two-dimensional material layer 5. In the lateral direction of two-dimensional material layer 5, a gap between end 7A and end 7B is smaller than the width of exposed part 4, for example.

When control electrode 7 is disposed so as to overlap two-dimensional material layer 5 in plan view as in electromagnetic wave detector 101 illustrated in FIG. 11, photocarriers are not accumulated at the interface between control electrode 7 and semiconductor substrate 1. Therefore, the photogating effect does not appear in the portion, of two-dimensional material layer 5 disposed on first insulating film 2, disposed on control electrode 7.

On the other hand, in electromagnetic wave detector 102A, control electrode 7 is disposed in the region where control electrode 7 does not overlap two-dimensional material layer 5 in plan view, so that the photogating effect appears all over two-dimensional material layer 5 disposed on first insulating film 2. Therefore, electromagnetic wave detector 102A is higher in amplification factor of photocurrent generated by the photogating effect than electromagnetic wave detector 101.

Further, in electromagnetic wave detector 101, first insulating film 2 is disposed between two-dimensional material layer 5 and control electrode 7 disposed immediately below two-dimensional material layer 5. In this case, a portion of first insulating film 2 disposed on control electrode 7 protrudes relative to a portion of first insulating film 2 disposed on semiconductor substrate 1 by the thickness of control electrode 7. That is, a protrusion due to control electrode 7 is formed on the upper surface of first insulating film 2. When two-dimensional material layer 5 is formed on such a first insulating film 2, there is a possibility that the adhesion between two-dimensional material layer 5 and first insulating film 2 will be partially reduced, and a portion that is not in contact with first insulating film 2, in other words, a portion that separates from the upper surface of first insulating film 2, will be formed in two-dimensional material layer 5. In this case, the portion of two-dimensional material layer 5 that is not in contact with first insulating film 2 has no photogating effect, so that the amplification factor of photocurrent is limited. Further, there is a possibility that two-dimensional material layer 5 will be damaged by the protrusion of first insulating film 2.

On the other hand, in electromagnetic wave detector 102A, control electrode 7 is not disposed immediately below two-dimensional material layer 5, so that first insulating film 2 disposed between two-dimensional material layer 5 and semiconductor substrate 1 is flat. Therefore, in electromagnetic wave detector 102A, the problem caused by the protrusion of first insulating film 2 as described above does not occur.

In addition to the above-described effects, electromagnetic wave detector 102A can produce the same effects as the effects of electromagnetic wave detector 101.
(Modification)

Figure 14:
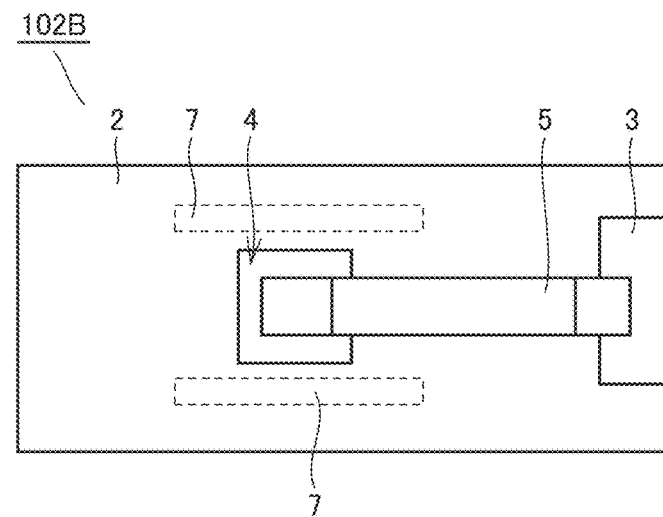
FIG. 14 is a schematic cross-sectional view of a first modification of the electromagnetic wave detector according to the third embodiment.

FIG. 14 is a diagram illustrating an electromagnetic wave detector 102B that is a modification of electromagnetic wave detector 102A. As illustrated in FIG. 14, electromagnetic wave detector 102B includes a plurality of control electrodes 7. The plurality of control electrodes 7 are arranged around joint part 12 so as to place joint part 12 between control electrodes 7 in at least one direction. The plurality of control electrodes 7 are arranged so as to place joint part 12 between control electrodes 7 in the lateral direction of two-dimensional material layer 5, for example.

The plurality of control electrodes 7 are covered with first insulating film 2, for example. The plurality of control electrodes 7 are arranged around joint part 12 so as to place exposed part 4 between control electrodes 7, for example.

Each control electrode 7 has, for example, a longitudinal direction and a lateral direction. The longitudinal direction of each control electrode 7 coincides with the longitudinal direction of two-dimensional material layer 5, for example. The width of each control electrode 7 in the longitudinal direction is greater than the width of joint part 12 in the direction, for example. One end of each control electrode 7 in the longitudinal direction is disposed closer to first electrode 3 than joint part 12, for example.

Figure 15:
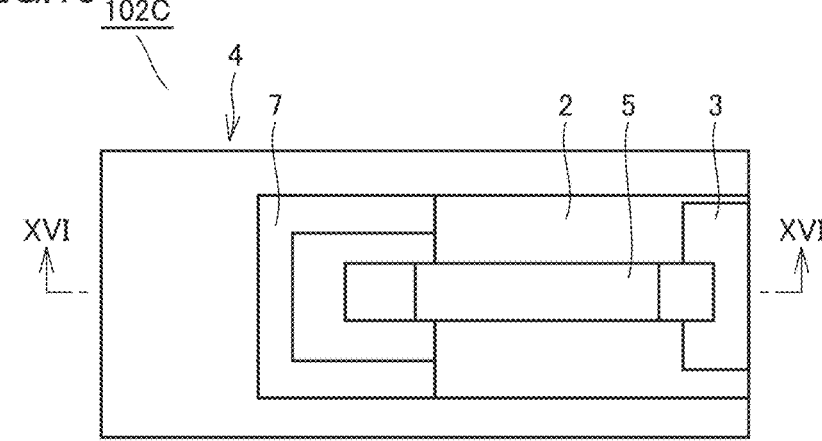
FIG. 15 is a schematic cross-sectional view of a second modification of the electromagnetic wave detector according to the third embodiment.
Figure 16:
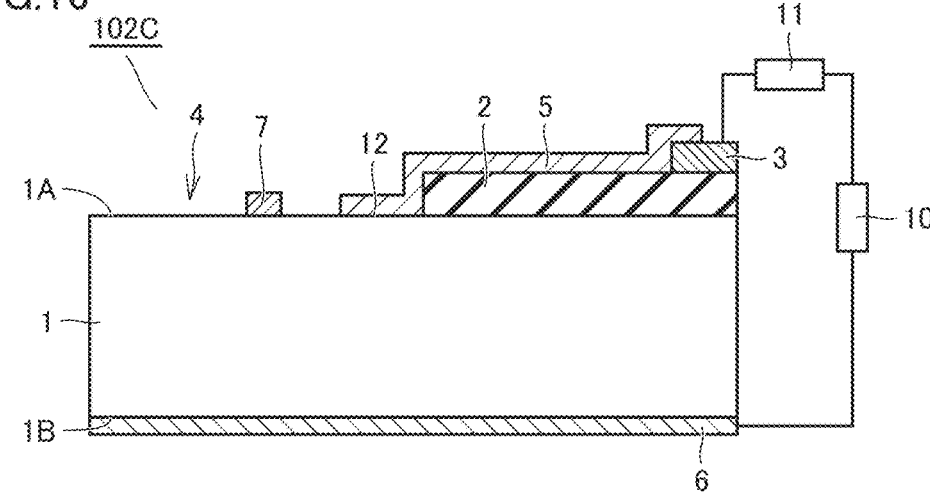
FIG. 16 is a schematic cross-sectional view taken along a line XV-XVI in FIG. 15.

FIGS. 15 and 16 are diagrams illustrating an electromagnetic wave detector 102C that is a modification of electromagnetic wave detector 102A. As illustrated in FIGS. 15 and 16, in electromagnetic wave detector 102C, most of first surface 1A of semiconductor substrate 1 serves as exposed part 4. First insulating film 2 is formed so as to prevent the tunnel current from being generated between first electrode 3 and semiconductor substrate 1 and between a portion of two-dimensional material layer 5 located between joint part 12 and first electrode 3 and semiconductor substrate 1. Control electrode 7 is disposed on exposed part 4. In other words, control electrode 7 is exposed from first insulating film 2.

Electromagnetic wave detector 102A may be the same in configuration as electromagnetic wave detectors 100B, 100C except that control electrode 7 is disposed in the region where control electrode 7 does not overlap two-dimensional material layer in plan view.

Fourth Embodiment

Figure 17:
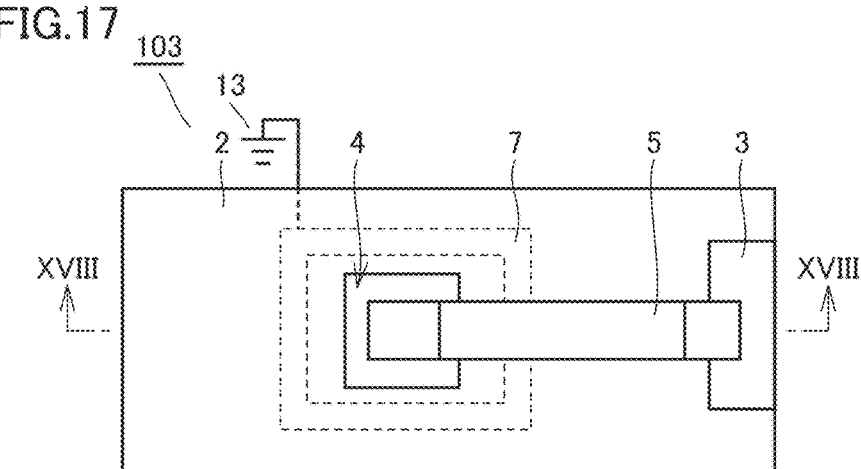
FIG. 17 is a schematic cross-sectional view of an electromagnetic wave detector according to a fourth embodiment.
Figure 18:
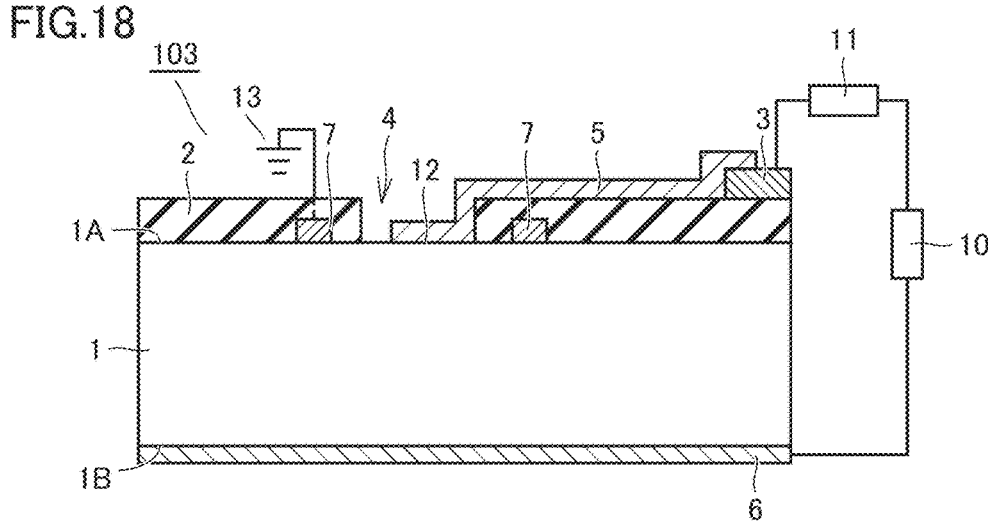
FIG. 18 is a schematic cross-sectional view taken along a line XVIII-XVIII in FIG. 17.

FIGS. 17 and 18 are diagrams illustrating an electromagnetic wave detector 103 according to a fourth embodiment. Electromagnetic wave detector 103 illustrated in FIGS. 17 and 18 has a configuration basically the same as the configuration of electromagnetic wave detector 101 according to the second embodiment, but is different from electromagnetic wave detector 101 in that control electrode 7 is grounded.

In electromagnetic wave detector 103, control electrode 7 is electrically connected to a ground node 13. For example, control electrode 7 is partially exposed from first insulating film 2 to electrically connect to a ground line electrically connected to ground node 13.

In electromagnetic wave detector 103, the potential of control electrode 7 is fixed. Therefore, even when a relatively large voltage is applied between first electrode 3 and second electrode 6, the potential of control electrode 7 does not increase, and the barrier height of the second Schottky junction between control electrode 7 and semiconductor substrate 1 does not decrease.

This allows electromagnetic wave detector 103 to reduce the dark current even when a relatively large voltage is applied between first electrode 3 and second electrode 6.

Note that, in an electromagnetic wave detector army in which the plurality of electromagnetic wave detectors 103 are connected to each other, control electrode 7 of each electromagnetic wave detector 103 may be individually and electrically connected to ground node 13. Further, in an electromagnetic wave detector array in which the plurality of electromagnetic wave detectors 103 are connected to each other, control electrodes 7 of electromagnetic wave detectors 103 may be electrically connected to each other to constitute a part of one ground line, and a point of the ground line may be electrically connected to ground node 13. The latter electromagnetic wave detector array can be made higher in the degree of integration of electromagnetic wave detectors 103 than the former electromagnetic wave detector array.

In addition to the above-described effects, electromagnetic wave detector 103 can produce the same effects as the effects of electromagnetic wave detector 101.
(Modification)

Note that electromagnetic wave detector 103 may be the same in configuration as electromagnetic wave detectors 100A, 100B, 100C, 102A, 102B, 102C except that control electrode 7 is grounded.

Fifth Embodiment

Figure 19:
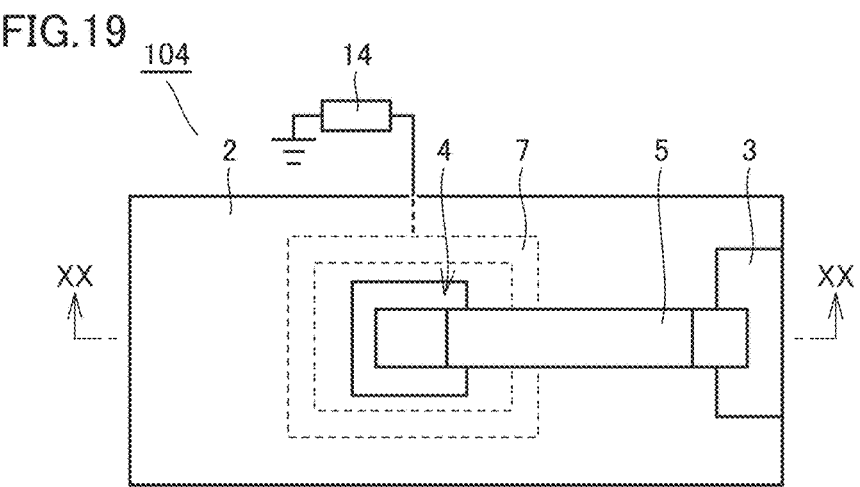
FIG. 19 is a schematic cross-sectional view of an electromagnetic wave detector according to a fifth embodiment.
Figure 20:
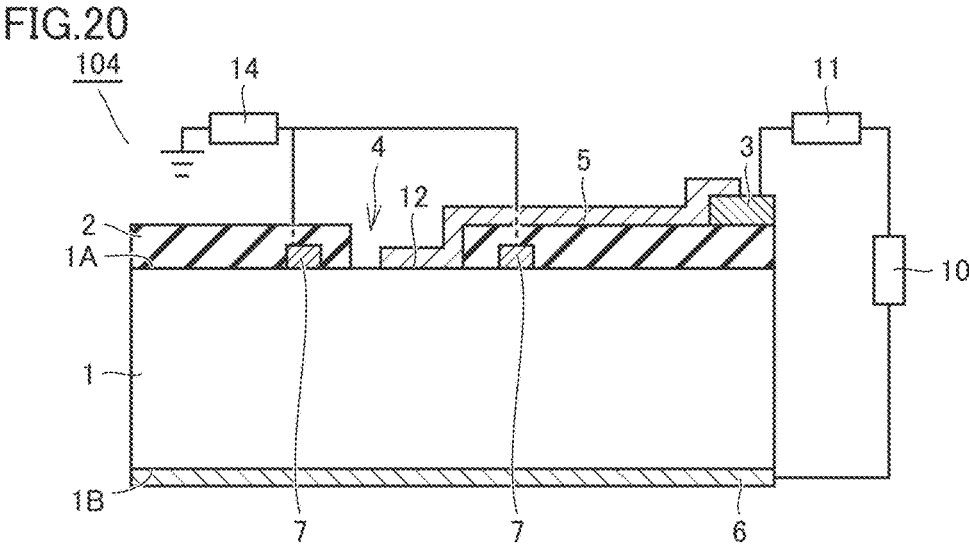
FIG. 20 is a schematic cross-sectional view taken along a line XX-XX in FIG. 19.

FIGS. 19 and 20 are diagrams illustrating an electromagnetic wave detector 104 according to a fifth embodiment. As illustrated in FIGS. 19 and 20, electromagnetic wave detector 104 has a configuration basically the same as the configuration of electromagnetic wave detector 101 according to the second embodiment, but is different from electromagnetic wave detector 101 in that control electrode 7 is connected to a power supply 14.

Electromagnetic wave detector 104 includes power supply 11 (first power supply) that applies a voltage (first voltage) between first electrode 3 and second electrode 6, and power supply 14 (second power supply) that applies a voltage (second voltage) to control electrode 7.

In electromagnetic wave detector 104, the potential of control electrode 7 can be set as desired by power supply 14, so that the barrier height of the second Schottky junction between control electrode 7 and semiconductor substrate 1 can be set as desired. The barrier height is set such that the low dark current region is formed wide and stable with respect to the voltage applied to first electrode 3, for example. As a result, in electromagnetic wave detector 104, the amount of photocurrent increases while variations in the dark current are reduced as compared with electromagnetic wave detector 101, so that the amount of photocurrent largely changes, and the detection sensitivity becomes high accordingly.

Further, in electromagnetic wave detector 104, applying a voltage to control electrode 7 allows an increase in internal electric field of the depletion layer formed at the interface between first insulating film 2 immediately below two-dimensional material layer 5 and semiconductor substrate 1 as compared with electromagnetic wave detector 101. The larger the internal electric field of the depletion layer, the more photocarriers accumulated at the interface. Therefore, electromagnetic wave detector 104 is higher in amplification factor of photocurrent generated by the photogating effect than electromagnetic wave detector 101.

In addition to the above-described effects, electromagnetic wave detector 104 can produce the same effects as the effects of electromagnetic wave detector 100A.
(Modification)

Note that electromagnetic wave detector 104 may be the same in configuration as electromagnetic wave detectors 100A, 100B, 100C, 102A, 102B, 102C except that control electrode 7 is connected to power supply 14.

Sixth Embodiment

Figure 21:
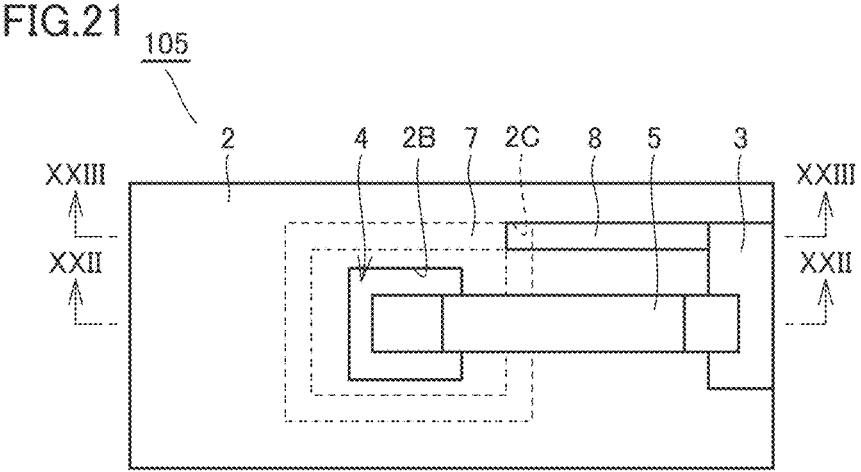
FIG. 21 is a schematic cross-sectional view of an electromagnetic wave detector according to a sixth embodiment.
Figure 22:
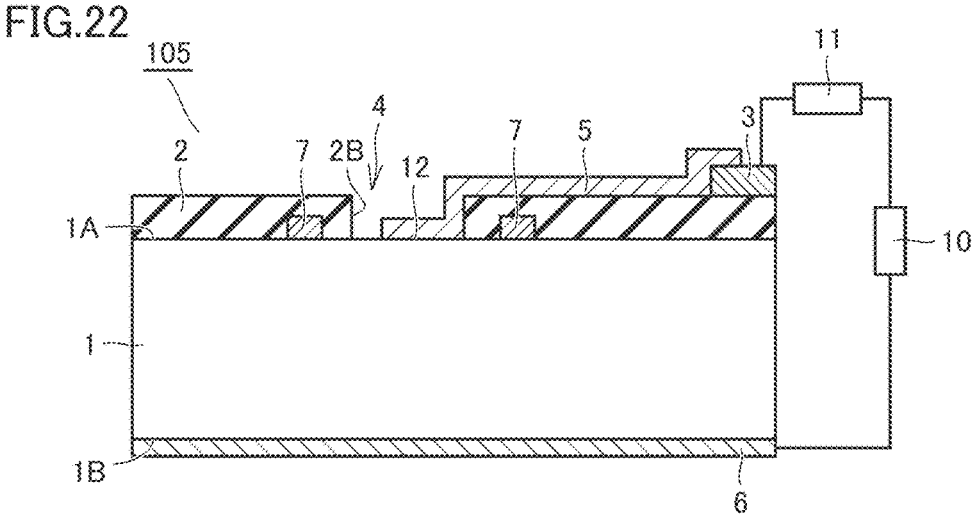
FIG. 22 is a schematic cross-sectional view taken along a line XXII-XXII in FIG. 21.
Figure 23:
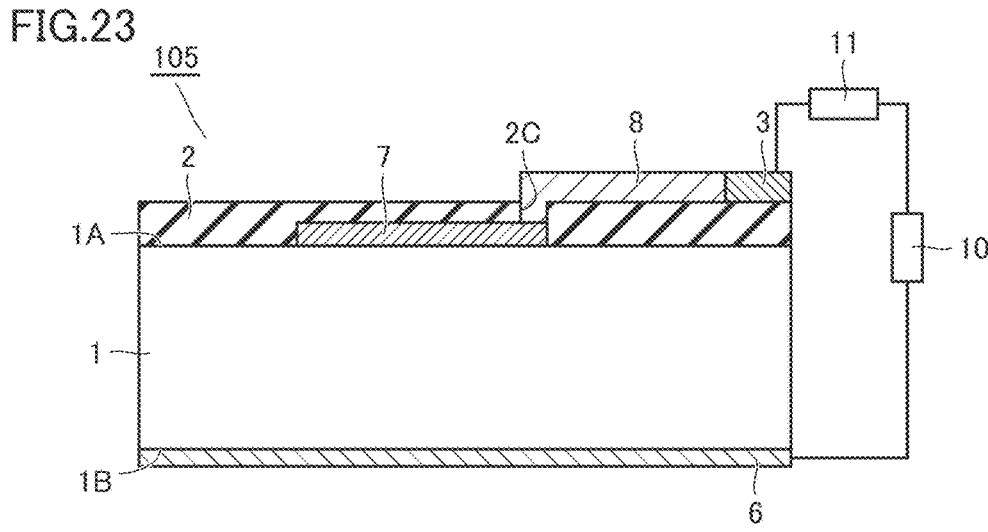
FIG. 23 is a schematic cross-sectional view taken along a line XXIII-XXIII in FIG. 21.

FIGS. 21 to 23 are diagrams illustrating an electromagnetic wave detector 105 according to a sixth embodiment. As illustrated in FIGS. 21 to 23, electromagnetic wave detector 105 has a configuration basically the same as the configuration of electromagnetic wave detector 101 according to the second embodiment, but is different from electromagnetic wave detector 101 in that control electrode 7 is electrically connected to first electrode 3.

Control electrode 7 is electrically connected to first electrode 3 through a lead-out electrode 8, for example. Lead-out electrode 8 is disposed on first insulating film 2 and control electrode 7. An opening 2B from which exposed part 4 of semiconductor substrate 1 is exposed and an opening 2C from which a part of control electrode 7 is exposed are formed in first insulating film 2. In plan view, opening 2C is disposed at a distance from opening 2B, for example.

Under the manufacturing method of electromagnetic wave detector 105, for example, the step (S1), the step (S2), the step (S3), the step (S4), the step (S6), the step (S5), and the step (S7) are performed in this order. Opening 2B and opening 2C are simultaneously formed in the exposed part forming step (S6), for example. First electrode 3 and lead-out electrode 8 are simultaneously formed in the first electrode forming step (S5) performed after the exposed part forming step (S6).

In electromagnetic wave detector 105, the potential of control electrode 7 is kept constant. Therefore, even when a relatively large voltage is applied between first electrode 3 and second electrode 6, the potential of control electrode 7 does not increase, and the barrier height of the second Schottky junction between control electrode 7 and semiconductor substrate 1 does not decrease. This allows electromagnetic wave detector 105 to reduce the dark current even when a relatively large voltage is applied between first electrode 3 and second electrode 6.

In addition to the above-described effects, electromagnetic wave detector 105 can produce the same effects as the effects of electromagnetic wave detector 101.
(Modification)

Note that electromagnetic wave detector 105 may be the same in configuration as electromagnetic wave detectors 100A, 100B, 100C, 102A, 102B, 102C except that control electrode 7 is electrically connected to first electrode 3.

Seventh Embodiment

Figure 24:
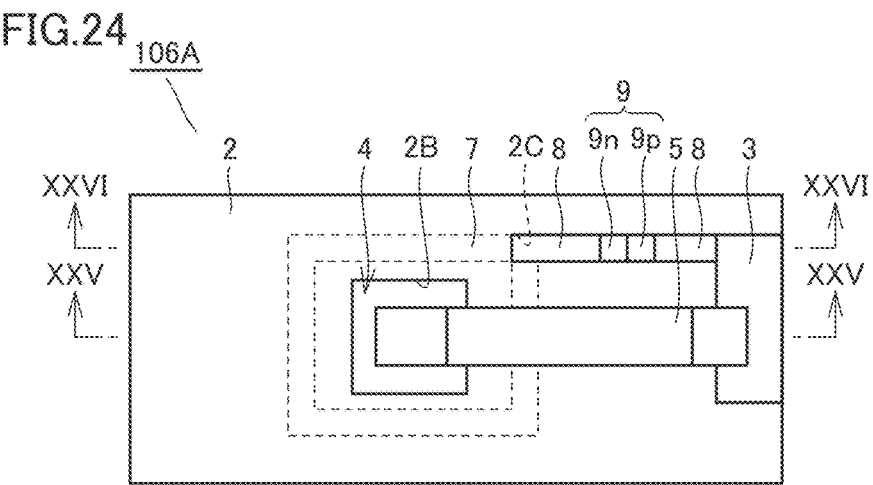
FIG. 24 is a schematic cross-sectional view of an electromagnetic wave detector according to a seventh embodiment.
Figure 25:
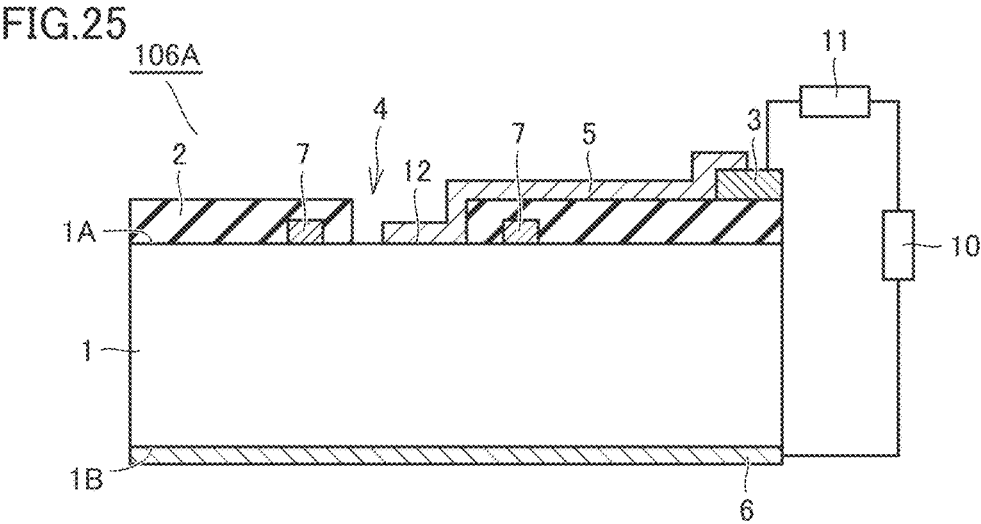
FIG. 25 is a schematic cross-sectional view taken along a line XXV-XXV in FIG. 24.
Figure 26:
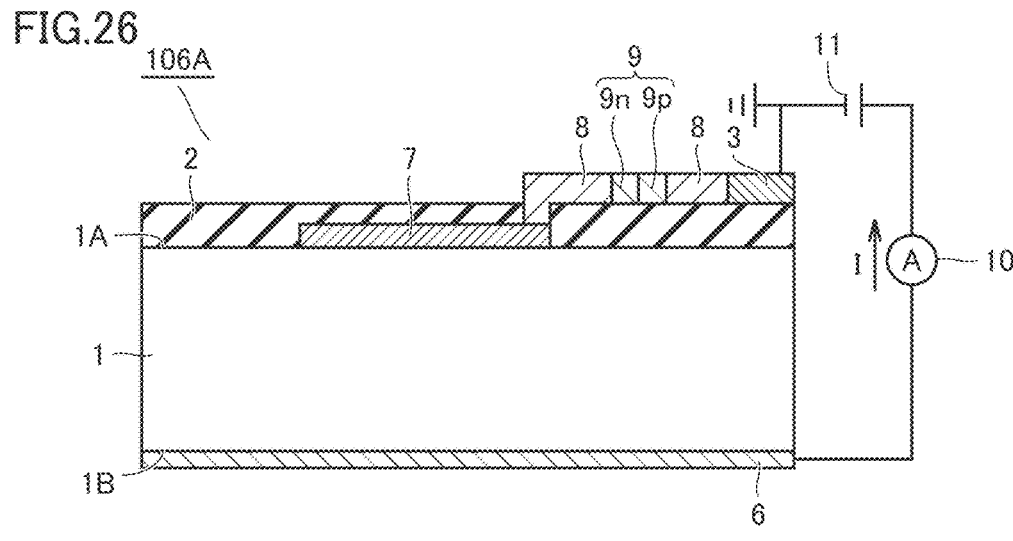
FIG. 26 is a schematic cross-sectional view taken along a line XXVI-XXVI in FIG. 24.

FIGS. 24 to 26 are diagrams illustrating an electromagnetic wave detector 106A according to a seventh embodiment. As illustrated in FIGS. 24 to 26, electromagnetic wave detector 106A has a configuration basically the same as the configuration of electromagnetic wave detector 105 according to the sixth embodiment, but is different from electromagnetic wave detector 105 in that a pn diode 9 including a cathode electrode electrically connected to control electrode 7 and an anode electrode electrically connected to first electrode 3 is further provided.

The cathode electrode of pn diode 9 is formed of, for example, a polysilicon thin film $9n$ having n-type conductivity. The anode electrode of pn diode 9 is formed of, for example, a polysilicon thin film $9p$ having p-type conductivity. Polysilicon thin film $9n$ and polysilicon thin film $9p$ are arranged side by side in the longitudinal direction of two-dimensional material layer 5 to form a pn junction. Polysilicon thin film $9n$ is electrically connected to control electrode 7 through lead-out electrode 8. Polysilicon thin film $9p$ is electrically connected to first electrode 3 through lead-out electrode 8. pn diode 9 is disposed on first insulating film 2.

pn diode 9 may be formed, for example, in the first electrode forming step (S5) or may be formed after the first electrode forming step (S5) and before the two-dimensional material layer forming step (S7).

In electromagnetic wave detector 106A, control electrode 7 is higher in potential than first electrode 3 by the built-in potential of pn diode 9. Therefore, the barrier height of the second Schottky junction between control electrode 7 and semiconductor substrate 1 can be increased without an increase in voltage applied to first electrode 3. As a result, in electromagnetic wave detector 106A, the dark current can be reduced, and variations in the dark current for each electromagnetic wave detector 106A can be reduced as compared with electromagnetic wave detector 105.

Further, pn diode 9 is connected in a manner as to prevent the photocarriers (holes when the conductivity type of semiconductor substrate 1 is n-type) from flowing from semiconductor substrate 1. Accordingly, when electromagnetic wave detector 106A is irradiated with the electromagnetic wave, the photocarriers generated in the depletion layer of semiconductor substrate 1 cannot flow into control electrode 7 but flow into joint part 12. This makes electromagnetic wave detector 106A higher in photocarrier extraction efficiency than electromagnetic wave detector 105 and thus allows electromagnetic wave detector 106A to obtain larger photocurrent.

In addition to the above-described effects, electromagnetic wave detector 106A can produce the same effects as the effects of electromagnetic wave detector 101.
(Modification)

Figure 27:
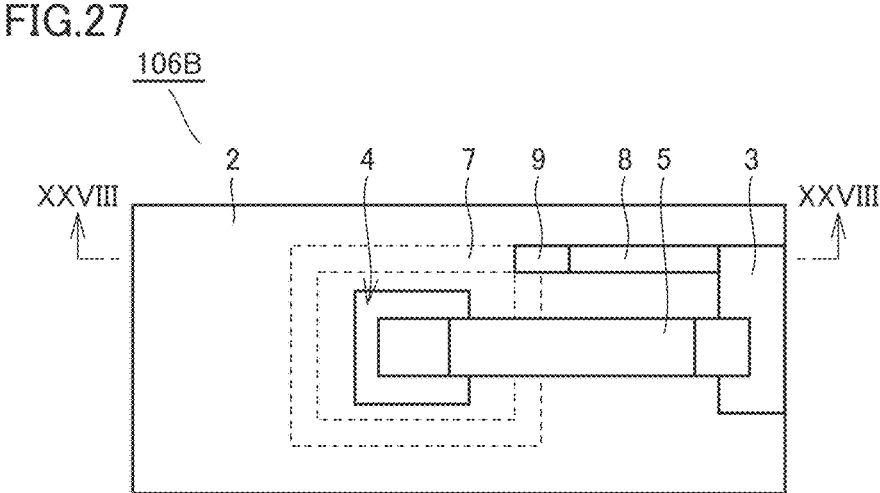
FIG. 27 is a schematic plan view of a modification of the electromagnetic wave detector according to the seventh embodiment.
Figure 28:
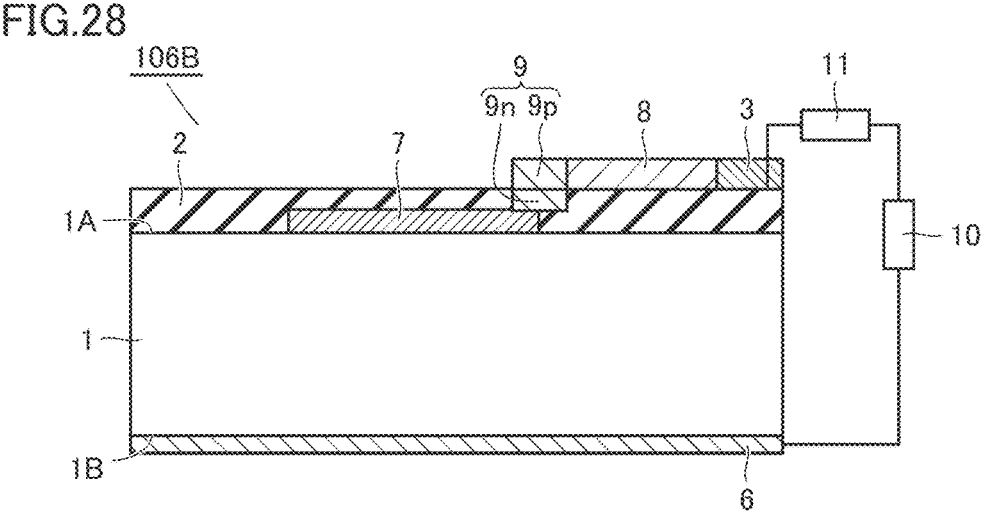
FIG. 28 is a schematic cross-sectional view taken along a line XXVIII-XXVIII in FIG. 27.

FIGS. 27 and 28 are diagrams illustrating an electromagnetic wave detector 106B that is a modification of electromagnetic wave detector 106A. As illustrated in FIGS. 27 and 28, in electromagnetic wave detector 106B, polysilicon thin film $9n$ is in contact with control electrode 7. Polysilicon thin film $9n$ is electrically connected to control electrode 7 without lead-out electrode 8. Note that pn diode 9 may be disposed at any position on a current path electrically connecting control electrode 7 and first electrode 3.

Electromagnetic wave detector 106A may be the same in configuration as electromagnetic wave detectors 100A, 100B, 10C, 102A, 102B, 102C except that pn diode 9 is further provided.

Eighth Embodiment

Figure 29:
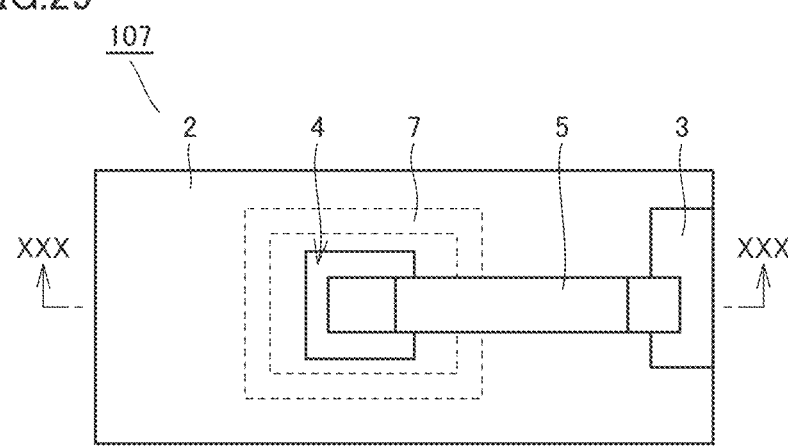
FIG. 29 is a schematic plan view of an electromagnetic wave detector according to an eighth embodiment.
Figure 30:
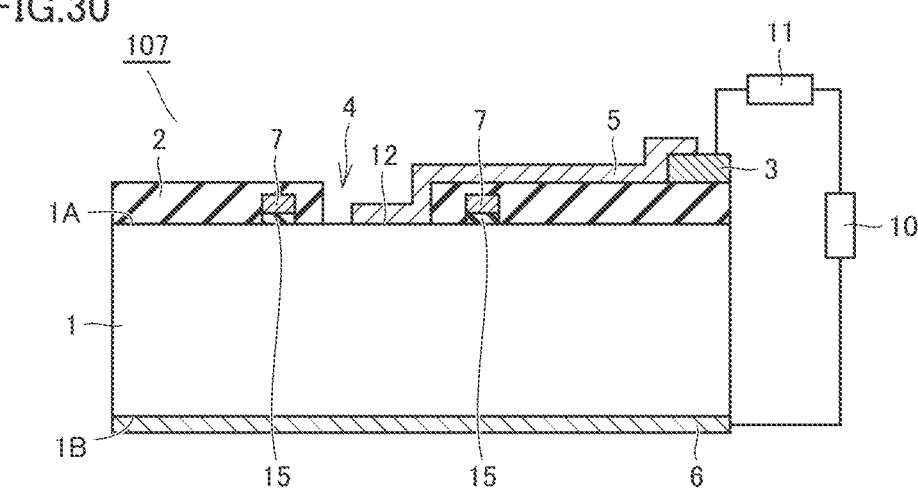
FIG. 30 is a schematic cross-sectional view taken along a line XXX-XXX in FIG. 29.

FIGS. 29 and 30 are diagrams illustrating an electromagnetic wave detector 107 according to an eighth embodiment. As illustrated in FIGS. 29 and 30, electromagnetic wave detector 107 has a configuration basically the same as the configuration of electromagnetic wave detector 101 according to the second embodiment, but is different from electromagnetic wave detector 101 in that a second insulating film 15 disposed between semiconductor substrate 1 and control electrode 7 is further provided.

Control electrode 7 forms a metal-insulator-semiconductor (MIS) Schottky junction with semiconductor substrate 1 with second insulating film 15 interposed between control electrode 7 and semiconductor substrate 1.

A material of second insulating film 15 includes, for example, at least one selected from the group consisting of silicon oxide ($SiO_2$), silicon nitride ($Si_3N_4$), hafnium oxide ($HfO_2$), aluminum oxide ($Al_2O_3$), nickel oxide (NiO), and boron nitride (BN). The material of second insulating film 15 may be, for example, the same as the material of first insulating film 2. A thickness of second insulating film 15 is not particularly limited as long as the metal-insulator-semiconductor (MIS) Schottky junction can be formed between control electrode 7 and semiconductor substrate 1.

Second insulating film 15 is formed before the control electrode forming step (S2).

In electromagnetic wave detector 107, second insulating film 15 prevents photocarriers from flowing into control electrode 7. This causes, when electromagnetic wave detector 107 is irradiated with the electromagnetic wave, photocarriers generated in the depletion layer of the semiconductor substrate 1 to flow into joint part 12. This makes electromagnetic wave detector 107 higher in photocarrier extraction efficiency than electromagnetic wave detector 101 and thus allows electromagnetic wave detector 107 to obtain larger photocurrent.

In addition to the above-described effects, electromagnetic wave detector 107 can produce the same effects as the effects of electromagnetic wave detector 101.
(Modification)

Electromagnetic wave detector 107 may be the same in configuration as electromagnetic wave detectors 100A, 100B, 100C, 102A, 102B, 102C, 103, 104, 105, 106 except that second insulating film 15 is further provided.

Ninth Embodiment

Figure 31:
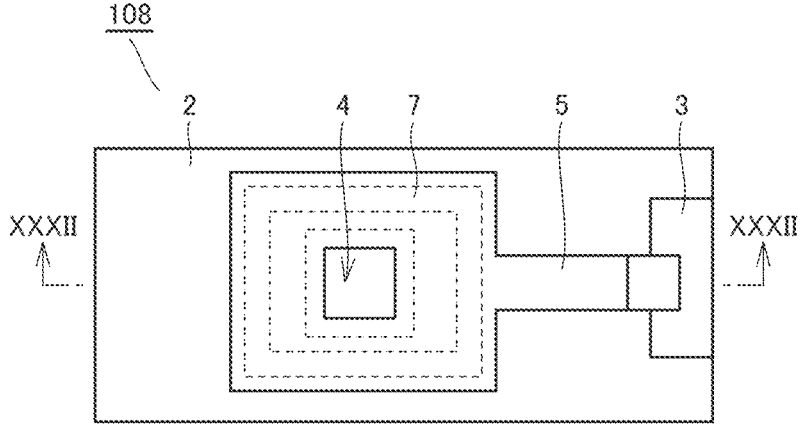
FIG. 31 is a schematic plan view of an electromagnetic wave detector according to a ninth embodiment.
Figure 32:
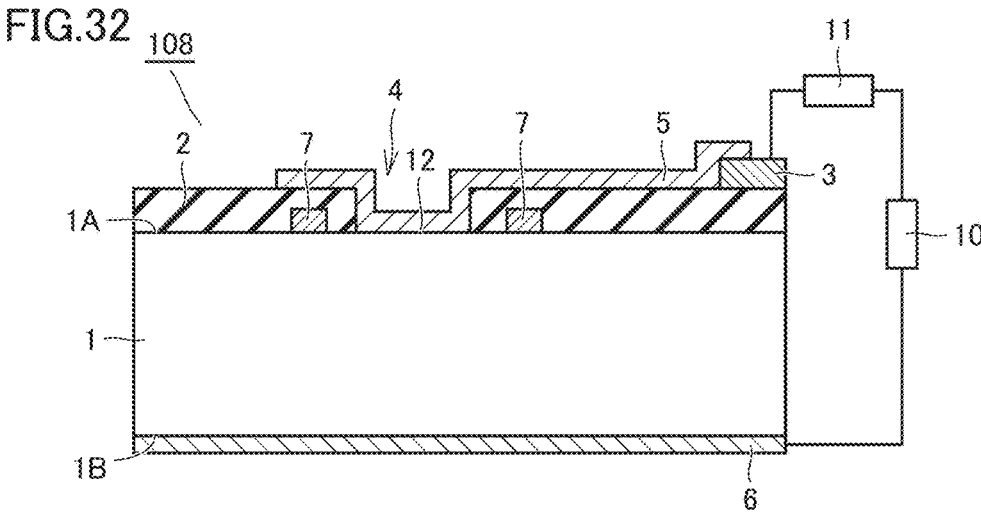
FIG. 32 is a schematic cross-sectional view taken along a line XXXII-XXXII in FIG. 31.

FIGS. 31 and 32 are diagrams illustrating an electromagnetic wave detector 108 according to a ninth embodiment. As illustrated in FIGS. 31 and 32, electromagnetic wave detector 108 has a configuration basically the same as the configuration of electromagnetic wave detector 101 according to the second embodiment, but is different from electromagnetic wave detector 101 in that two-dimensional material layer 5 is disposed so as to cover control electrode 7 with first insulating film 2 interposed between two-dimensional material layer 5 and control electrode 7.

Two-dimensional material layer 5 is disposed so as to cover exposed part 4, for example. Two-dimensional material layer 5 forms a Schottky junction with the whole of exposed part 4 of semiconductor substrate 1, for example. In plan view, an outer edge of two-dimensional material layer 5 is disposed outside an outer edge of control electrode 7, for example.

In electromagnetic wave detector 108, the voltage applied to first electrode 3 is applied to control electrode 7 through two-dimensional material layer 5 and first insulating film 2. Therefore, even when a relatively large voltage is applied between first electrode 3 and second electrode 6, the potential of control electrode 7 does not increase, and the barrier height of the second Schottky junction between control electrode 7 and semiconductor substrate 1 does not decrease.

This allows electromagnetic wave detector 108 to reduce the dark current even when a relatively large voltage is applied between first electrode 3 and second electrode 6.

In addition to the above-described effects, electromagnetic wave detector 108 can produce the same effects as the effects of electromagnetic wave detector 101.
(Modification)

Note that electromagnetic wave detector 108 may be the same in configuration as electromagnetic wave detectors 100A, 100B, 100C, 103, 104, 105, 106 except that two-dimensional material layer 5 is disposed so as to cover control electrode 7 with first insulating film 2 interposed between two-dimensional material layer 5 and control electrode 7.

Tenth Embodiment

Figure 33:
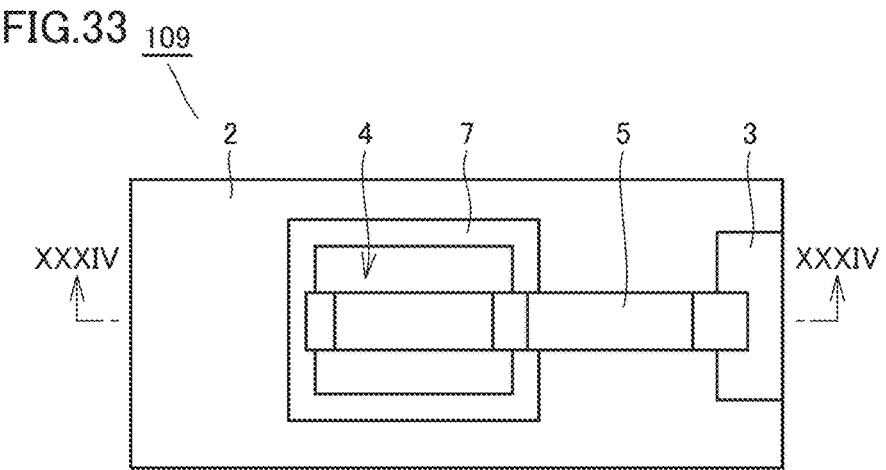
FIG. 33 is a schematic plan view of an electromagnetic wave detector according to a tenth embodiment.
Figure 34:
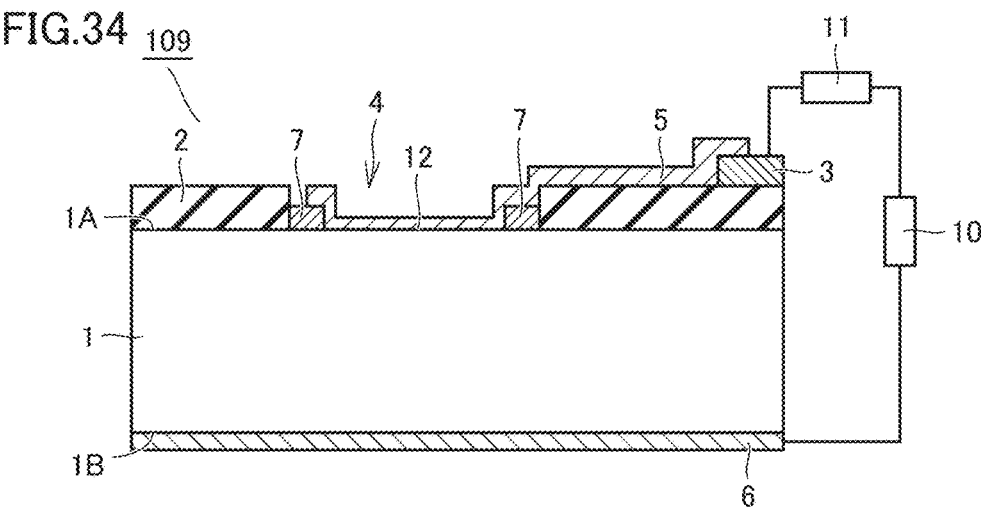
FIG. 34 is a schematic cross-sectional view taken along a line XXXIV-XXXIV in FIG. 33.

FIGS. 33 and 34 are diagrams illustrating an electromagnetic wave detector 109 according to a tenth embodiment. As illustrated in FIGS. 33 and 34, electromagnetic wave detector 109 has a configuration basically the same as the configuration of electromagnetic wave detector 101 according to the second embodiment, but is different from electromagnetic wave detector 101 in that control electrode 7 is in contact with two-dimensional material layer 5.

Control electrode 7 is at least partially exposed from first insulating film 2. In other words, control electrode 7 is at least partially disposed on exposed part 4. At least a part of the portion of control electrode 7 exposed from first insulating film 2 is in contact with two-dimensional material layer 5.

As illustrated in FIGS. 33 and 34, for example, control electrode 7 is entirely exposed from first insulating film 2. In plan view, control electrode 7 has, for example, a pair of portions arranged so as to place joint part 12 between the portions in the longitudinal direction of two-dimensional material layer 5. Two-dimensional material layer 5 is in contact with a part of the pair of portions of control electrode 7, for example.

In electromagnetic wave detector 109, the voltage applied to first electrode 3 is applied to control electrode 7 through two-dimensional material layer 5. Therefore, even when a relatively large voltage is applied between first electrode 3 and second electrode 6, the potential of control electrode 7 does not increase, and the barrier height of the second Schottky junction between control electrode 7 and semiconductor substrate 1 does not decrease.

This allows electromagnetic wave detector 109 to reduce the dark current even when a relatively large voltage is applied between first electrode 3 and second electrode 6.

In addition to the above-described effects, electromagnetic wave detector 109 can produce the same effects as the effects of electromagnetic wave detector 101.
(Modification)

Note that electromagnetic wave detector 108 may be the same in configuration as electromagnetic wave detectors 100A, 100B, 100C, 102A, 102B, 102C, 103, 104, 105, 106, 107 except that control electrode 7 is in contact with two-dimensional material layer 5.

Eleventh Embodiment

Figure 35:
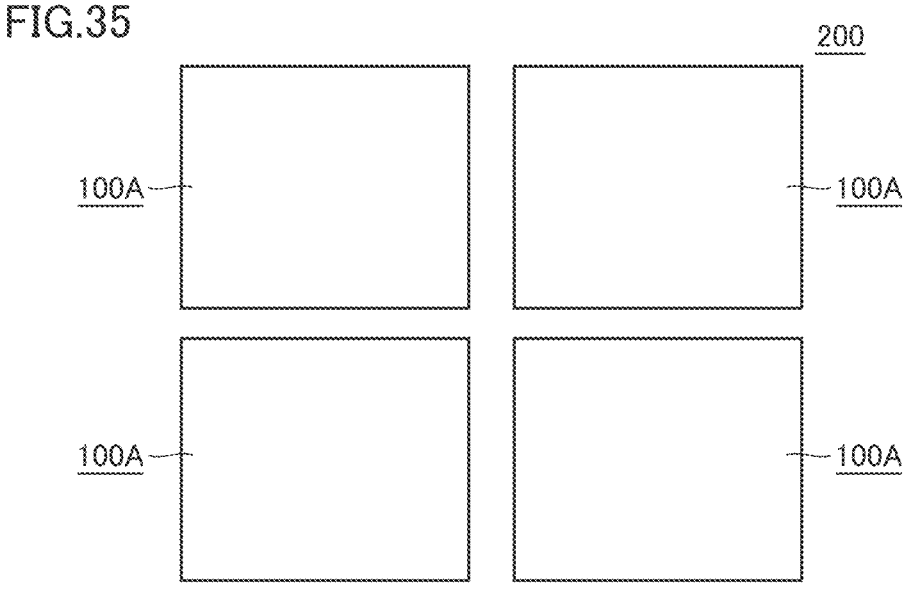
FIG. 35 is a schematic plan view of an electromagnetic wave detector array according to an eleventh embodiment.

FIG. 35 is a diagram illustrating an electromagnetic wave detector array 200 according to an eleventh embodiment. As illustrated in FIG. 35, electromagnetic wave detector array 200 includes a plurality of detection elements. The detection elements have the same configuration, each of the detection elements corresponding to any one of electromagnetic wave detectors 100A, 100B, 100C, 101, 101B. 102A, 102B, 102C, 103, 104, 105, 106, 106A, 106B, 107, 108, 109 according to the first to tenth embodiments. Electromagnetic wave detector array 200 includes a plurality of electromagnetic wave detectors 100A, for example.

In electromagnetic wave detector array 200, the plurality of electromagnetic wave detectors 100A are identical in detection wavelength to each other. As illustrated in FIG. 35, electromagnetic wave detector array 200 has the plurality of electromagnetic wave detectors 100A arranged in a two-dimensional array. In other words, the plurality of electromagnetic wave detectors 100A are arranged side by side in a first direction and a second direction intersecting the first direction. Electromagnetic wave detector array 200 illustrated in FIG. 35 has four electromagnetic wave detectors 100A arranged in a 2-by-2 array. Note that the number of electromagnetic wave detectors 100A to be arranged is not limited to the above. For example, the plurality of electromagnetic wave detectors 100A may be arranged in a 3-by-3 array or larger array.

Note that, in electromagnetic wave detector array 200 illustrated in FIG. 35, the plurality of electromagnetic wave detectors 100A are two-dimensionally arranged at regular intervals, but the plurality of electromagnetic wave detectors 100A may be arranged in one direction at regular intervals. The intervals between the plurality of electromagnetic wave detectors 100A may be equal to or different from each other.

When the plurality of electromagnetic wave detectors 100A are arranged in an array, second electrode 6 may serve as a common electrode as long as electromagnetic wave detectors 100 are separated. Using second electrode 6 as a common electrode makes it possible to reduce the number of wires of pixels as compared with the configuration where each electromagnetic wave detector 100A has individual second electrode 6. This can make the electromagnetic wave detector array higher in resolution.

Electromagnetic wave detector array 200 having the plurality of electromagnetic wave detectors 100A arranged in an array as described above can also be used as an image sensor, a line sensor, or a position sensor that determines the position of an object.

(Modification)

Electromagnetic wave detector array 200 may include a plurality of electromagnetic wave detectors 100B, 100C, 101, 101B, 102A, 102B, 102C, 103, 104, 105, 106, 106A, 106B, 107, 108, or 109.

Electromagnetic wave detector array 200 may include a plurality of electromagnetic wave detectors according to any one of the first to eleventh embodiments, or may include a plurality of electromagnetic wave detectors according to two or more of the first to eleventh embodiments.

Figure 36:
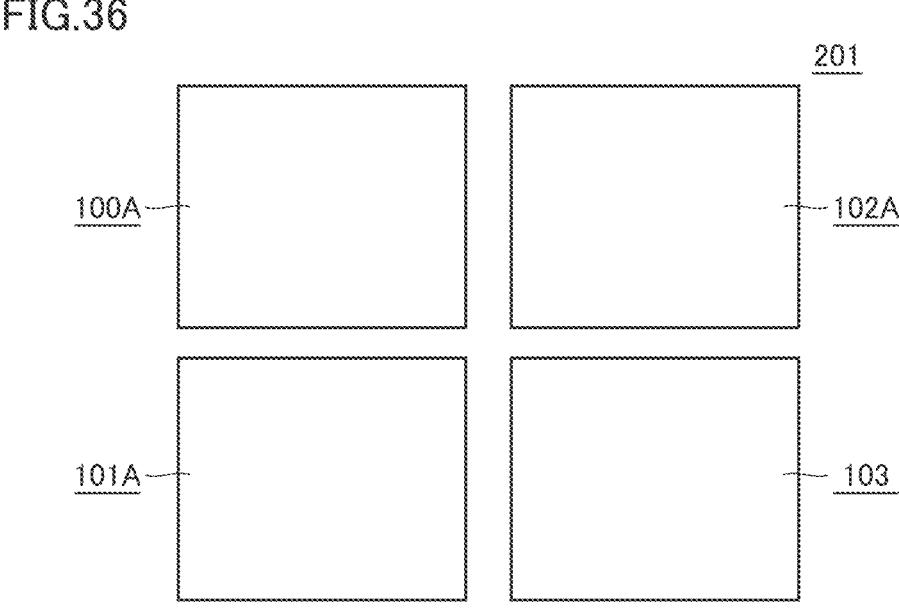
FIG. 36 is a schematic plan view of a modification of the electromagnetic wave detector array according to the eleventh embodiment.

An electromagnetic wave detector array 201 illustrated in FIG. 36 has a configuration basically the same as the configuration of electromagnetic wave detector array 200 illustrated in FIG. 35 and can produce the same effects, but is different from the electromagnetic wave detector array 200 illustrated in FIG. 35 in that different types of electromagnetic wave detectors are provided as the plurality of electromagnetic wave detectors. That is, in electromagnetic wave detector array 201 illustrated in FIG. 36, electromagnetic wave detectors of different types are arranged in an array (matrix).

Electromagnetic wave detector array 201 illustrated in FIG. 36 having electromagnetic wave detectors of different types according to any one of the first to tenth embodiments arranged in a one-dimensional or two-dimensional array can also be used as an image sensor, a line sensor, or a position sensor that determines the position of an object.

Further, the electromagnetic wave detectors included in electromagnetic wave detector array 201 may be, for example, electromagnetic wave detectors different in detection wavelength from each other. Specifically, the electromagnetic wave detectors are electromagnetic wave detectors according to any one of the first to tenth embodiments, and may be prepared as electromagnetic wave detectors different in detection wavelength selectivity from each other. In this case, the electromagnetic wave detector array can detect electromagnetic waves of at least two different wavelengths.

Arranging the plurality of electromagnetic wave detectors different in detection wavelength from each other in an array as described above makes it possible to identify a wavelength of an electromagnetic wave within any desired wavelength region such as a wavelength region of ultraviolet light, a wavelength region of infrared light, a wavelength region of terahertz waves, or a wavelength region of radio waves, like an image sensor adapted to the visible light region. This makes it possible to obtain a colored image in which a difference in wavelength is represented as a difference in color, for example.

It is possible to modify or omit as needed each of the above-described embodiments. It is further possible to variously modify each of the above-described embodiments without departing from the gist thereof in an implementation phase. Further, the above-described embodiments include inventions in various phases, and various inventions can be extracted by suitably combining a plurality of disclosed components.

It should be understood that the embodiments disclosed herein are illustrative in all respects and not restrictive. At least two of the embodiments disclosed herein may be combined as long as there is no inconsistency. The scope of the present invention is defined by the claims rather than the above description, and the present invention is intended to include the claims, equivalents of the claims, and all modifications within the scope.

REFERENCE SIGNS LIST

1: semiconductor substrate, 1A: first surface, 1B: second surface, 2: first insulating film, 2A: end surface, 2B, 2C: opening, 3: first electrode. 4: exposed part, 5: two-dimensional material layer, 6: second electrode, 7: control electrode, 7A, 7B: end, 8: electrode, 9: pn diode, 9n, 9p: polysilicon thin film, 10: ammeter, 11, 14: power supply, 12: joint part, 13: ground node, 15: second insulating film, 100, 100A, 100B, 100C, 101, 101B, 102A, 102B, 102C, 103, 104, 105, 106, 106A, 106B, 107, 108, 109: electromagnetic wave detector, 200, 201: electromagnetic wave detector array

The invention claimed is:

1. An electromagnetic wave detector comprising:
   a semiconductor substrate;
   a first insulating film disposed on the semiconductor substrate and formed so as to expose a part of the semiconductor substrate;
   a first electrode disposed on the first insulating film;
   a two-dimensional material layer having a joint part forming a first Schottky junction with the semiconductor substrate in a part of the semiconductor substrate, the two-dimensional material layer extending from the joint part to the first electrode over the first insulating film;
   a second electrode in contact with the semiconductor substrate; and a control electrode disposed at least partly around the joint part in plan view to form a second Schottky junction with the semiconductor substrate, wherein the two-dimensional material layer has a portion that extends over an upper surface of the first insulating film to the first electrode and is in contact with the first insulating film, the two-dimensional material layer and the control electrode are disposed such that a depletion layer formed as a result of the connection of a depletion layer of the second Schottky junction to a depletion layer formed in the first Schottky junction when the first Schottky junction is reverse-biased covers an entire interface of the first Schottky junction, and the control electrode is disposed all around the joint part in plan view.

2. The electromagnetic wave detector according to claim 1, wherein the control electrode is not in contact with the two-dimensional material layer.

3. The electromagnetic wave detector according to claim 1, wherein the control electrode is in contact with the two-dimensional material layer.

4. An electromagnetic wave detector comprising:

a semiconductor substrate;

a first insulating film disposed on the semiconductor substrate and formed so as to expose a part of the semiconductor substrate;

a first electrode disposed on the first insulating film;

a two-dimensional material layer having a joint part forming a first Schottky junction with the semiconductor substrate in a part of the semiconductor substrate, the two-dimensional material layer extending from the joint part to the first electrode over the first insulating film;

a second electrode in contact with the semiconductor substrate; and a control electrode disposed at least partly around the joint part in plan view to form a second Schottky junction with the semiconductor substrate, wherein the two-dimensional material layer has a portion that extends over an upper surface of the first insulating film to the first electrode and is in contact with the first insulating film, the two-dimensional material layer and the control electrode are disposed such that a depletion layer formed as a result of the connection of a depletion layer of the second Schottky junction to a depletion layer formed in the first Schottky junction when the first Schottky junction is reverse-biased covers an entire interface of the first Schottky junction, and the two-dimensional material layer is disposed so as to cover the control electrode with the first insulating film interposed between the two-dimensional material layer and the control electrode.

5. The electromagnetic wave detector according to claim 1, wherein the control electrode is disposed in a region where the control electrode does not overlap the two-dimensional material layer in plan view.

6. The electromagnetic wave detector according to claim 1, wherein the control electrode is connected to a ground node.

7. The electromagnetic wave detector according to claim 1, wherein the control electrode is electrically connected to the first electrode.

8. The electromagnetic wave detector according to claim 7, further comprising a pn diode including a cathode electrode electrically connected to the control electrode and an anode electrode electrically connected to the first electrode.

9. The electromagnetic wave detector according to claim 1, further comprising:

a first power supply to apply a voltage between the first electrode and the second electrode; and a second power supply to apply a voltage to the control electrode.

10. The electromagnetic wave detector according to claim 1, further comprising a second insulating film disposed between the semiconductor substrate and the control electrode, wherein the control electrode forms a Schottky junction with the semiconductor substrate with the second insulating film interposed between the control electrode and the semiconductor substrate.

11. The electromagnetic wave detector according to claim 1, wherein a material of the control electrode includes metal.

12. An electromagnetic wave detector array comprising a plurality of electromagnetic wave detectors according to claim 1, wherein the plurality of electromagnetic wave detectors are arranged side by side in at least either a first direction or a second direction.

13. A manufacturing method of an electromagnetic wave detector, comprising:

preparing a semiconductor substrate;

forming a control electrode to form a first Schottky junction with the semiconductor substrate;

forming an insulating film on the semiconductor substrate, the insulating film exposing a part of the semiconductor substrate;

forming a first electrode on the insulating film;

forming a second electrode in contact with the semiconductor substrate; and forming a two-dimensional material layer having a joint part forming a second Schottky junction with the semiconductor substrate in a part of the semiconductor substrate, the two-dimensional material layer extending from the joint part to the first electrode over the insulating film, wherein the forming a two-dimensional material layer causes the control electrode to be disposed at least partly around the joint part in plan view, the two-dimensional material layer has a portion that extends over an upper surface of the first insulating film to the first electrode and is in contact with the first insulating film, the two-dimensional material layer and the control electrode are disposed such that a depletion layer formed as a result of the connection of a depletion layer of the second Schottky junction to a depletion layer formed in the first Schottky junction when the first Schottky junction is reverse-biased covers an entire interface of the first Schottky junction, and the control electrode is disposed all around the joint part in plan view.

14. The electromagnetic wave detector according to claim 2, wherein the two-dimensional material layer is disposed so as to cover the control electrode with the first insulating film interposed between the two-dimensional material layer and the control electrode.

15. The electromagnetic wave detector according to claim 1, wherein the two-dimensional material layer is disposed so as to cover the control electrode with the first insulating film interposed between the two-dimensional material layer and the control electrode.

16. The electromagnetic wave detector according to claim 2, wherein the control electrode is disposed in a region where the control electrode does not overlap the two-dimensional material layer in plan view.

* * * * *